United States Patent
Sasaki et al.

(10) Patent No.: US 10,884,078 B2
(45) Date of Patent: Jan. 5, 2021

(54) FERROMAGNETIC MULTILAYER FILM, MAGNETORESISTANCE EFFECT ELEMENT, AND METHOD FOR MANUFACTURING FERROMAGNETIC MULTILAYER FILM

(71) Applicant: TDK CORPORATION, Tokyo (JP)

(72) Inventors: Tomoyuki Sasaki, Tokyo (JP); Yoshitomo Tanaka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/794,927

(22) Filed: Feb. 19, 2020

(65) Prior Publication Data
US 2020/0191887 A1   Jun. 18, 2020

Related U.S. Application Data

(63) Continuation of application No. 16/099,628, filed as application No. PCT/JP2018/007300 on Feb. 27, 2018, now Pat. No. 10,613,162.

(30) Foreign Application Priority Data

Feb. 28, 2017 (JP) ................. 2017-037245

(51) Int. Cl.
*H01L 43/10* (2006.01)
*G01R 33/09* (2006.01)
(Continued)

(52) U.S. Cl.
CPC ......... *G01R 33/093* (2013.01); *G01R 33/098* (2013.01); *G11C 11/161* (2013.01);
(Continued)

(58) Field of Classification Search
CPC ....... H01L 27/226; H01L 43/02; H01L 43/08; H01L 43/10; H01L 43/12
See application file for complete search history.

(56) References Cited

U.S. PATENT DOCUMENTS 5,465,185 A   11/1995   Heim et al.
6,175,476 B1   1/2001   Huai et al.
(Continued)

FOREIGN PATENT DOCUMENTS

| JP | 2010-021580 A | 1/2010 |
|---|---|---|
| JP | 2011-142326 A | 7/2011 |
| WO | 2016/159017 A1 | 10/2016 |

OTHER PUBLICATIONS

Apr. 29, 2020 Office Action issued in U.S. Appl. No. 16/083,202.
(Continued)

*Primary Examiner* — Cuong Q Nguyen
(74) *Attorney, Agent, or Firm* — Oliff PLC

(57) ABSTRACT

A ferromagnetic multilayer film includes first and second magnetization fixed layers, first and second interposed layers, and a magnetic coupling layer. The magnetization fixed layers are antiferromagnetically coupled by exchange coupling via the interposed layers and the magnetic coupling layer. A main element of the magnetic coupling layer is Ru, Rh, or Ir. A main element of the first interposed layer is the same as that of the magnetic coupling layer. A main element of the second interposed layer is different from that of the magnetic coupling layer. A thickness of the first interposed layer is greater than or equal to 1.5 times and less than or equal to 3.2 times an atomic radius of the main element of the first interposed layer. A thickness of the second interposed layer is less than or equal to 1.5 times an atomic radius of the main element of the second interposed layer.

16 Claims, 14 Drawing Sheets

(51) Int. Cl.

| | | |
|---|---|---|
| *H01L 43/02* | (2006.01) | |
| *H01L 27/22* | (2006.01) | |
| *H01L 43/08* | (2006.01) | |
| *G11C 11/16* | (2006.01) | |
| *H01L 21/8239* | (2006.01) | |
| *H01L 43/06* | (2006.01) | |
| *H01L 43/04* | (2006.01) | |
| *H01L 41/20* | (2006.01) | |
| *H01L 45/00* | (2006.01) | |
| *G11C 13/00* | (2006.01) | |
| *H01F 10/32* | (2006.01) | |
| *H01L 43/12* | (2006.01) | |

(52) U.S. Cl.
CPC ....... *G11C 13/0002* (2013.01); *H01F 10/329* (2013.01); *H01F 10/3286* (2013.01); *H01L 21/8239* (2013.01); *H01L 27/222* (2013.01); *H01L 27/226* (2013.01); *H01L 41/20* (2013.01); *H01L 43/02* (2013.01); *H01L 43/04* (2013.01); *H01L 43/06* (2013.01); *H01L 43/065* (2013.01); *H01L 43/08* (2013.01); *H01L 43/10* (2013.01); *H01L 43/12* (2013.01); *H01L 45/1233* (2013.01); *H01L 27/228* (2013.01)

(56) References Cited

U.S. PATENT DOCUMENTS

| | | |
|---|---|---|
| 2003/0103299 A1 | 6/2003 | Saito |
| 2005/0018363 A1 | 1/2005 | Hasegawa et al. |
| 2007/0086121 A1 | 4/2007 | Nagase et al. |
| 2008/0113220 A1 | 5/2008 | Sun et al. |
| 2008/0253038 A1 | 10/2008 | Nakabayashi et al. |
| 2010/0118600 A1 | 5/2010 | Nagase et al. |
| 2012/0008381 A1 | 1/2012 | Nagase et al. |
| 2012/0069640 A1 | 3/2012 | Nagase et al. |
| 2013/0299929 A1 | 11/2013 | Watanabe et al. |
| 2016/0268496 A1* | 9/2016 | Yamane ............. H01L 43/08 |
| 2018/0019388 A1 | 1/2018 | Fukami et al. |
| 2018/0190898 A1* | 7/2018 | Wang ............. H01L 43/08 |
| 2018/0240844 A1 | 8/2018 | Yang et al. |
| 2019/0006414 A1* | 1/2019 | Huai ............. H01L 43/10 |

OTHER PUBLICATIONS

Parkin, S.S.P., "Systematic Variation of the Strength and Oscillation Period of Indirect Magnetic Exchange Coupling through the 3d, 4d, and 5d Transition Metals," Physical Review Letters, Dec. 16, 1991, vol. 67, No. 25, pp. 3598-3601.

Parkin, S.S.P., "Spin engineering: Direct determination of the Ruderman-Kittel-Kasuya-Yosida far-field range function in ruthenium," Physical Review B, Oct. 1, 1991, vol. 44, No. 13, pp. 7131-7134.

Yakushiji et al., "Very strong antiferromagnetic interlayer exchange coupling with indium spacer layer for perpendicular magnetic tunnel junctions," Applied Physics Letters, 2017, vol. 110, pp. 092406-1-092406-4.

Yakushiji et al., "Ultralow-Voltage Spin-Transfer Switching in Perpendicularly Magnetized Magnetic Tunnel Junctions with Synthetic Antiferromagnetic Reference Layer," Applied Physics Express, 2003, vol. 6, pp. 113006-1-113006-4.

Sep. 12, 2019 International Preliminary Report on Patentability issued on International Application No. PCT/JP2018/007300.

Aug. 13, 2019 Office Action issued in U.S. Appl. No. 16/083,202.

Sep. 12, 2019 International Preliminary Report on Patentability issued in International Patent Application No. PCT/JP2017/038987.

Jan. 2, 2020 Office Action issued in U.S. Appl. No. 16/083,202.

* cited by examiner (a)

(b)

(a)

(b)

(a)

(b)

(a)

(b)

FERROMAGNETIC MULTILAYER FILM, MAGNETORESISTANCE EFFECT ELEMENT, AND METHOD FOR MANUFACTURING FERROMAGNETIC MULTILAYER FILM

This is a Continuation of application Ser. No. 16/099,628 filed Nov. 7, 2018, which is a National Stage Application of PCT/JP2018/007300 filed Feb. 27, 2018, which in turn claims priority to Japanese Application No. 2017-037245 filed Feb. 28, 2017. The entire disclosures of the prior applications are hereby incorporated by reference herein their entirety.

TECHNICAL FIELD

The present disclosure relates to a ferromagnetic multilayer film, a magnetoresistive effect element, and a method for manufacturing a ferromagnetic multilayer film.

BACKGROUND ART

Magnetoresistive effect elements such as a giant magnetoresistive (GMR) effect element and a tunnel magnetoresistive (TMR) effect element having a configuration in which a ferromagnetic layer as a magnetization fixed layer, a non-magnetic spacer layer, and a ferromagnetic layer as a magnetization free layer are stacked in this order are known. In recent years, such a magnetoresistive effect element has drawn attention as an element used in a magnetic sensor, a magnetic head, a magnetoresistive random access memory (MRAM), and the like.

The magnetization direction of the magnetization fixed layer in the magnetoresistive effect element is fixed such that the magnetization direction does not substantially change at the time of using the element. Thus, the magnetization direction of the magnetization fixed layer is not substantially changed by an external magnetic field (for example, a magnetic field of a measurement target in the magnetic sensor) and a spin torque (for example, a spin torque caused by spin injection magnetization reversal in the MRAM) that may be applied to the magnetization fixed layer at the time of using the element. However, when the fixing of the magnetization direction of the magnetization fixed layer is weakened due to any cause, and a deviation of the magnetization direction from a predetermined direction occurs, problems such as a decrease in magnetoresistive effect ratio (MR ratio) and a decrease in the symmetry of an output signal with respect to the external magnetic field are posed.

A ferromagnetic multilayer film called a synthesized anti-ferromagnetic structure (hereinafter, referred to as an "SAF structure") is known as a technology for strongly fixing the magnetization direction of the magnetization fixed layer (refer to Patent Literatures 1 and 2 and Non-Patent Literatures 1 and 2). The SAF structure is composed of a first magnetization fixed layer formed of a ferromagnetic material, a second magnetization fixed layer formed of a ferromagnetic material, and a magnetic coupling layer that is formed of a non-magnetic metal and is interposed between the first magnetization fixed layer and the second magnetization fixed layer. The first magnetization fixed layer and the second magnetization fixed layer are antiferromagnetically coupled to each other by an exchange coupling magnetic field $H_{EX}$ via the magnetic coupling layer. Accordingly, magnetic flux occurring from the first magnetization fixed layer and magnetic flux occurring from the second magnetization fixed layer are distributed such that the magnetic fluxes as a whole forms a circulating path. The material and the film thickness of the magnetization coupling layer in the SAF structure are selected such that the exchange coupling magnetic field $H_{EX}$ is strengthened as far as possible. Accordingly, since the magnetization directions of the first magnetization fixed layer and the second magnetization fixed layer are not easily changed by the external magnetic field and the spin torque, the magnetization directions can be strongly fixed.

CITATION LIST

Patent Literature

[Patent Literature 1] U.S. Pat. No. 5,465,185
[Patent Literature 2] U.S. Pat. No. 6,175,476

Non Patent Literature

[Non-Patent Literature 1] S. S. P. Parkin, D. Mauri, "Spin engineering: Direct determination of the Ruderman-Kittel-Kasuya-Yosida far-field range function in ruthenium", Phys. Rev. B, Vol. 44, p. 7131-7134 (1991)
[Non-Patent Literature 2] S. S. P. Parkin, "Systematic Variation of the Strength and Oscillation Period of Indirect Magnetic Exchange Coupling through the 3d, 4d, and 5d Transition Metals", Phys, Rev. Lett. Vol. 67, p. 3598-3601 (1991)

SUMMARY

The exchange coupling magnetic field $H_{EX}$ in the SAF structure is strongly affected by the state of an interface between the first magnetization fixed layer or the second magnetization fixed layer and the magnetization coupling layer, and it is known that as the interface becomes abrupt, a higher exchange coupling magnetic field $H_{EX}$ is acquired. However, when elements are diffused between the first magnetization fixed layer or the second magnetization fixed layer and the magnetization coupling layer in the vicinity of the interface, the interface becomes non-abrupt. Consequently, the exchange coupling magnetic field $H_{EX}$ is decreased, and the fixing of the magnetization directions of the first and second magnetization fixed layers is weakened. Such diffusion of elements in the interface is caused by, for example, activation of an interface region caused by plasma at the time of forming each layer constituting the SAF structure using sputtering or activation of the interface region caused by an annealing process in a manufacturing step for the SAF structure, the magnetoresistive effect element, or a device including the magnetoresistive effect element. Thus, it is difficult to completely prevent such diffusion. Thus, in the ferromagnetic multilayer film having the SAF structure in the related art and the magnetoresistive effect element including the ferromagnetic multilayer film, the fixing of the magnetization direction of the magnetization fixed layer is sometimes weakened.

The present disclosure is conceived in view of the above problem. An object of the present disclosure is to provide a ferromagnetic multilayer film that includes two ferromagnetic layers and has a high antiferromagnetic exchange coupling magnetic field between these layers, and a magnetoresistive effect element or the like including such a ferromagnetic multilayer film.

In order to solve the above problem, a ferromagnetic multilayer film according to the present disclosure includes a first ferromagnetic layer, a first interposed layer that is stacked on the first ferromagnetic layer, a second interposed layer that is stacked on the first interposed layer, a magnetic coupling layer that is stacked on the second interposed layer, and a second ferromagnetic layer that is stacked on the magnetic coupling layer. The first ferromagnetic layer and the second ferromagnetic layer are magnetically coupled by exchange coupling via the first interposed layer, the second interposed layer, and the magnetic coupling layer such that magnetization directions of the first ferromagnetic layer and the second ferromagnetic layer are antiparallel to each other. A main element of the magnetic coupling layer is Ru, Rh, or Ir. A main element of the first interposed layer is the same as the main element of the magnetic coupling layer. A main element of the second interposed layer is different from the main element of the magnetic coupling layer. A thickness of the first interposed layer is greater than or equal to 1.5 times and less than or equal to 3.2 times an atomic radius of the main element of the first interposed layer. A thickness of the second interposed layer is less than or equal to 1.5 times an atomic radius of the main element of the second interposed layer.

In the ferromagnetic multilayer film according to the present disclosure, the diffusion of the element constituting the first ferromagnetic layer to the magnetic coupling layer and the diffusion of the element constituting the magnetic coupling layer to the first ferromagnetic layer are suppressed by the presence of the second interposed layer. In addition, the thicknesses and the arrangement of the first interposed layer and the second interposed layer are determined such that those layers do not substantially affect or sufficiently slightly affect the exchange coupling between the first ferromagnetic layer and the second ferromagnetic layer. Thus, according to the ferromagnetic multilayer film according to the present disclosure, the antiferromagnetic exchange coupling magnetic field between the first ferromagnetic layer and the second ferromagnetic layer is strengthened.

Furthermore, in the ferromagnetic multilayer film according to the present disclosure, the main element of the second interposed layer may be the same as a main element of the first ferromagnetic layer. In this case, since the same element as the main element of the first ferromagnetic layer is present in a region between the first ferromagnetic layer and the magnetic coupling layer, entropy related to the main element of the first ferromagnetic layer is increased, compared to that in a case where a different element is present in the region. Thus, the main element of the first ferromagnetic layer is not thermodynamically easily diffused toward the magnetic coupling layer, compared to that in a case where a different element is present in the region. Consequently, the antiferromagnetic exchange coupling magnetic field between the first ferromagnetic layer and the second ferromagnetic layer is further strengthened.

Furthermore, in the ferromagnetic multilayer film according to the present disclosure, the main element of the second interposed layer may be, for example, Mo or W. In this case, the thermal resistance of the ferromagnetic multilayer film can be improved.

Furthermore, in the ferromagnetic multilayer film according to the present disclosure, the main element of the second interposed layer may be Ti, Zr, Pd, Ag, Hf, Pt, or Au. It is known that Ti, Zr, Pd, Ag, Hf, Pt, and Au, even if included in a magnetic coupling layer between two ferromagnetic layers, almost do not affect the exchange coupling between the two ferromagnetic layers. Thus, in this case, the variation of the magnitude of an antiferromagnetic exchange coupling magnetic field between the first ferromagnetic layer and the second ferromagnetic layer among a plurality of the ferromagnetic multilayer films according to the present disclosure can be suppressed.

Furthermore, in the ferromagnetic multilayer film according to the present disclosure, a thickness of the first ferromagnetic layer may be greater than a thickness of the second ferromagnetic layer. In this case, in a configuration in the related art, the diffusion of elements to the magnetic coupling layer from the first ferromagnetic layer occurs more easily than the diffusion of elements to the magnetic coupling layer from the second ferromagnetic layer. Thus, in this case, the effect of the ferromagnetic multilayer film of the present disclosure to suppress the diffusion of the element constituting the first ferromagnetic layer to the magnetic coupling layer by the presence of the second interposed layer is particularly effectively exhibited.

Furthermore, the ferromagnetic multilayer film according to the present disclosure may further include a third interposed layer that is stacked between the magnetic coupling layer and the second ferromagnetic layer, and a fourth interposed layer that is stacked between the third interposed layer and the second ferromagnetic layer. A main element of the fourth interposed layer may be the same as the main element of the magnetic coupling layer. A main element of the third interposed layer may be different from the main element of the magnetic coupling layer. A thickness of the fourth interposed layer may be greater than or equal to 1.5 times and less than or equal to 3.2 times an atomic radius of the main element of the fourth interposed layer. A thickness of the third interposed layer may be less than or equal to 1.5 times an atomic radius of the main element of the third interposed layer. In this case, based on the same reason as the reason why the diffusion of the element constituting the first ferromagnetic layer to the magnetic coupling layer and the diffusion of the element constituting the magnetic coupling layer to the first ferromagnetic layer can be suppressed by the first interposed layer and the second interposed layer, the diffusion of the element constituting the second ferromagnetic layer to the magnetic coupling layer and the diffusion of the element constituting the magnetic coupling layer to the second ferromagnetic layer can be suppressed by the third interposed layer and the fourth interposed layer. Consequently, the antiferromagnetic exchange coupling magnetic field between the first ferromagnetic layer and the second ferromagnetic layer is further strengthened.

In addition, a magnetoresistive effect element according to the present disclosure includes any ferromagnetic multilayer film described above, a non-magnetic spacer layer that is stacked on the second ferromagnetic layer, and a magnetization free layer that is stacked on the non-magnetic spacer layer and is formed of a ferromagnetic material. The first ferromagnetic layer and the second ferromagnetic layer function as magnetization fixed layers. Accordingly, since the magnetoresistive effect element includes the ferromagnetic multilayer film in which the antiferromagnetic exchange coupling magnetic field between the first ferromagnetic layer and the second ferromagnetic layer is strong as described above, problems caused by weak fixing of the magnetization directions of the magnetization fixed layers such as a decrease in magnetoresistive effect ratio (MR ratio) and a decrease in the symmetry of an output signal with respect to an external magnetic field can be suppressed.

In addition, a magnetic sensor according to the present disclosure includes the magnetoresistive effect element as described above, and a magnetic memory according to the present disclosure includes the magnetoresistive effect element as described above.

In addition, a method of manufacturing the ferromagnetic multilayer film according to the present disclosure includes a step of forming the first ferromagnetic layer, the first interposed layer, the second interposed layer, the magnetic coupling layer, and the second ferromagnetic layer in this order on a substrate. In the method of manufacturing the ferromagnetic multilayer film according to the present disclosure, the first ferromagnetic layer is formed earlier than the magnetic coupling layer. Accordingly, even if the element constituting the first ferromagnetic layer is activated by plasma or the like at the time of forming the first ferromagnetic layer using sputtering, the element is not diffused to the magnetic coupling layer at that time. Thus, the ferromagnetic multilayer film in which the antiferromagnetic exchange coupling magnetic field between the first ferromagnetic layer and the second ferromagnetic layer is particularly strong can be acquired.

According to the present disclosure, it is possible to provide a ferromagnetic multilayer film that includes two ferromagnetic layers and has a high antiferromagnetic exchange coupling magnetic field between these layers, and a magnetoresistive effect element or the like including such a ferromagnetic multilayer film.

DESCRIPTION OF EMBODIMENTS

Figure 1:
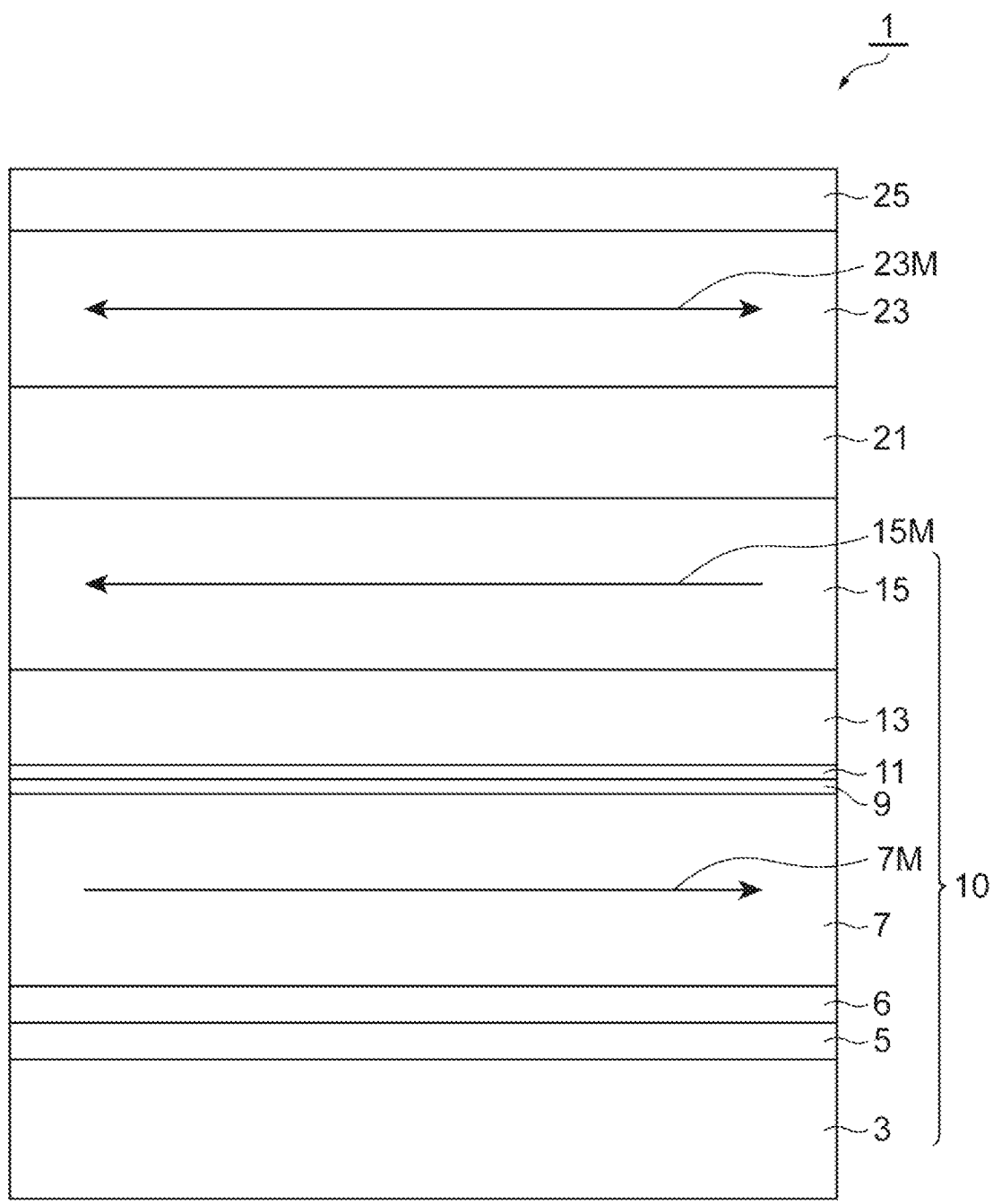
FIG. 1 is a view illustrating a cross-section of a magnetoresistive effect element including a ferromagnetic multilayer film according to an embodiment.

Hereinafter, an embodiment of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

Configurations of Ferromagnetic Multilayer Film and Magnetoresistive Effect Element FIG. 1 is a view illustrating a cross-section of a magnetoresistive effect element including a ferromagnetic multilayer film according to the embodiment. A magnetoresistive effect element 1 of the present embodiment includes a ferromagnetic multilayer film 10, a non-magnetic spacer layer 21 stacked on the ferromagnetic multilayer film 10, a magnetization free layer 23 stacked on the non-magnetic spacer layer 21, and a cap layer 25 stacked on the magnetization free layer 23. The magnetoresistive effect element 1 is a magnetoresistive effect element having a current perpendicular to plane (CPP) structure in which a detection current flows in the stack direction (direction perpendicular to the film surface of each layer). The ferromagnetic multilayer film 10 of the present embodiment includes a substrate 3, a crystal orientation layer 5 stacked on the principal surface of the substrate 3, a base layer 6 stacked on the crystal orientation layer 5, a first magnetization fixed layer 7 as a first ferromagnetic layer stacked on the base layer 6, a first interposed layer 9 stacked on the first magnetization fixed layer 7, a second interposed layer 11 stacked on the first interposed layer 9, a magnetic coupling layer 13 stacked on the second interposed layer 11, and a second magnetization fixed layer 15 as a second ferromagnetic layer stacked on the magnetic coupling layer 13.

The substrate 3 is formed, for example, of a monocrystalline metal oxide, monocrystalline silicon, monocrystalline silicon with a thermal oxide film, monocrystalline sapphire, ceramic, quartz, or glass. A material included in the substrate 3 is not particularly limited, provided that the material has appropriate mechanical strength and is appropriate for heat treatment or micromachining For example, the monocrystalline metal oxide is exemplified, for example, by monocrystalline MgO. In the substrate that includes monocrystalline MgO, an epitaxial growth film is easily formed on the substrate.

The crystal orientation layer 5 is a layer for controlling the crystal orientation of an upper layer and includes, for example, at least one of MgO, TiN, or a NiTa alloy. The ferromagnetic multilayer film 10 may not include the crystal orientation layer 5.

The base layer 6 functions as a lower electrode for causing a flow of detection current and is formed of, for example, at least one metal of Ag, Au, Cu, Cr, V, Al, W, or Pt. The base layer 20 may include an alloy of these metals, or a stack body of materials of two or more kinds of these metals.

Each of the first magnetization fixed layer 7 and the second magnetization fixed layer 15 is formed of a ferromagnetic material such as Co, a Co—Fe alloy, or a Co—Fe—B alloy. The thickness of the first magnetization fixed layer 7 is, for example, greater than or equal to 2 nm and less than or equal to 4 nm. The thickness of the second magnetization fixed layer 15 is, for example, greater than or equal to 1 nm and less than or equal to 3 nm. The thickness of the first magnetization fixed layer 7 is preferably greater than the thickness of the second magnetization fixed layer 15.

The first interposed layer 9 is disposed between the first magnetization fixed layer 7 and the magnetic coupling layer 13 so as to be in contact with the first magnetization fixed layer 7. The main element of the first interposed layer 9 is the same as the main element of the magnetic coupling layer 13. The main element of the first interposed layer 9 means an element of which the atomic ratio is the highest among elements constituting the first interposed layer 9. In a case where the first interposed layer 9 is formed of substantially a single element, its main element is the single element itself. In the following description, the same applies to the main elements of other layers. In addition, the case where the main element of the first interposed layer 9 is the same as the main element of the magnetic coupling layer 13 includes a case where the first interposed layer 9 and the magnetic coupling layer 13 are formed of substantially the same material. In the following description, the same applies to a case where two layers in other combinations are described as having the same main element. In addition, as will be described below, since the main element of the magnetic coupling layer 13 is Ru, Rh, or Ir, the main element of the first interposed layer 9 is also Ru, Rh, or Ir.

The thickness of the first interposed layer 9 is greater than or equal to 1.5 times (preferably greater than or equal to 1.65 times) and less than or equal to 3.2 times the atomic radius of the main element of the first interposed layer 9. For example, in a case where the first interposed layer 9 is formed of Ir, the thickness of the first interposed layer 9 is greater than or equal to 0.191 nm and less than or equal to 0.406 nm because the atomic radius of Ir is 0.127 nm. In a case where the thickness of the first interposed layer 9 is less than twice the atomic radius of the main element of the first interposed layer 9, the thickness is less than or equal to the thickness of one atom of the main element. In this case, the first interposed layer 9 cannot have a continuous shape in the plane direction and has a discontinuous shape in the plane direction such as the shape of a plurality of islands. In this case, the thickness of the first interposed layer 9 is defined as a thickness in a case where the first interposed layer 9 is assumed to have a uniform thickness by calculating the arithmetic mean of the first interposed layer 9 on the whole upper surface of the first magnetization fixed layer 7. In addition, in this case, the thickness of the first interposed layer 9 can be evaluated using elemental analysis such as EDS and thus the half width of the EDS profile of an element constituting the first interposed layer 9 or the distance between the intersections of the EDS profiles of upper and lower layers in contact with the first interposed layer 9 and the EDS profile of the element constituting the first interposed layer 9 can be selected based on a reasonable determination. The reason is that while in principle, it is correct to define the half width of the EDS profile as a thickness, the actual thickness does not necessarily match the distance of the half width because the EDS profile is affected by other signals. Since it is possible to confirm that a gap is not present between each layer using a TEM image, defining the distance of the half width of the EDS profile as a thickness may lead to an understanding that a gap is present between each layer. In this case, since the presence of the gap is not correct based on a reasonable determination, a thickness that is adjusted to the actual thickness can be defined by considering the distance between the intersections of the EDS profiles as a thickness.

The second interposed layer 11 is disposed between the first magnetization fixed layer 7 and the magnetic coupling layer 13 so as to be in contact with the magnetic coupling layer 13. The main element of the second interposed layer 11 is different from the main element (Ru, Rh, or Ir) of the magnetic coupling layer 13. The thickness of the second interposed layer 11 is less than or equal to 1.5 times the atomic radius of the main element of the second interposed layer 11. For example, in a case where the second interposed layer 11 is formed of Co, the thickness of the second interposed layer 11 is less than or equal to 0.174 nm because the atomic radius of Co is 0.116 nm. Since the thickness of the second interposed layer 11 is less than or equal to 1.5 times the atomic radius of the main element of the second interposed layer 11, the thickness is less than the thickness of one atom of the main element. Thus, in a region where the second interposed layer 11 is formed on the lower surface of the magnetic coupling layer 13, the second interposed layer 11 does not have a continuous shape in the plane direction and has a discontinuous shape in the plane direction such as the shape of a plurality of islands. In this case, the thickness of the second interposed layer 11 is defined as a thickness in a case where the second interposed layer 11 is assumed to have a uniform thickness by calculating the arithmetic mean of the second interposed layer 11 on the whole lower surface of the magnetic coupling layer 13. In addition, in this case, the thickness of the second interposed layer 11 can be evaluated using elemental analysis such as EDS and can be appropriately defined as the half width of the EDS profile of an element constituting the second interposed layer 11 or the distance between the intersections of the EDS profiles of an upper and lower layers in contact with the second interposed layer 11 and the EDS profile of the element constituting the second interposed layer 11. The reason is that while in principle, it is correct to define the half width of the EDS profile as a thickness, the actual thickness does not necessarily match the distance of the half width because the EDS profile is affected by other signals. Since it is possible to confirm that a gap is not present between each layer using a TEM image, defining the distance of the half width of the EDS profile as a thickness may lead to an understanding that a gap is present between each layer. In this case, since the presence of the gap is not correct based on a reasonable determination, a thickness that is adjusted to the actual thickness can be defined by considering the distance between the intersections of the EDS profiles as a thickness.

Table 1 is a periodic table of elements written with the atomic radius of each element. In this periodic table, the atomic radius of each element represented in units of angstroms (Å) is written in parentheses between the atomic number and the element symbol of each element. The atomic radius of each element in the present disclosure is defined as a value written in the periodic table.

TABLE 1

| Period | | 1A | 2A | 3A | 4A | 5A | 6A | 7A | 8 | | | 1B | 2B | 3B | 4B | 5B | 6B | 7B | 0 |
|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 |
| Short Period | 1 | 1 (0.32) H | | | | | | | | | | | | | | | | | 2 (0.31) He |
| | 2 | 3 (1.23) Li | 4 (0.89) Be | | | | | | | | | | | 5 (0.82) B | 6 (0.77) C | 7 (0.75) N | 8 (0.73) O | 9 (0.72) F | 10 (0.71) Ne |
| | 3 | 11 (1.54) Na | 12 (1.36) Mg | | | | | | | | | | | 13 (1.18) Al | 14 (1.11) Si | 15 (1.06) P | 16 (1.02) S | 17 (0.99) Cl | 18 (0.98) Ar |
| Long Period | 4 | 19 (2.03) K | 20 (1.74) Ca | 21 (1.44) Sc | 22 (1.32) Ti | 23 (1.22) V | 24 (1.18) Cr | 25 (1.17) Mn | 26 (1.17) Fe | 27 (1.16) Co | 28 (1.15) Ni | 29 (1.17) Cu | 30 (1.25) Zn | 31 (1.26) Ga | 32 (1.22) Ge | 33 (1.20) As | 34 (1.17) Se | 35 (1.14) Br | 36 (1.12) Kr |
| | 5 | 37 (2.16) Rb | 38 (1.91) Sr | 39 (1.62) Y | 40 (1.45) Zr | 41 (1.34) Nb | 42 (1.30) Mo | 43 (1.27) Tc | 44 (1.25) Ru | 45 (1.25) Rh | 46 (1.28) Pd | 47 (1.34) Ag | 48 (1.48) Cd | 49 (1.44) In | 50 (1.40) Sn | 51 (1.40) Sb | 52 (1.36) Te | 53 (1.33) I | 54 (1.31) Xe |
| | 6 | 55 (2.35) Cs | 56 (1.98) Ba | La—Lu 57-71 *Note 1 | 72 (1.44) Hf | 73 (1.34) Ta | 74 (1.30) W | 75 (1.28) Re | 76 (1.26) Os | 77 (1.27) Ir | 78 (1.30) Pt | 79 (1.34) Au | 80 (1.29) Hg | 81 (1.48) Tl | 82 (1.47) Pb | 83 (1.46) Bi | 84 (1.46) Po | 85 (1.45) At | 86 Rn |
| | 7 | 87 Fr | 88 (2.20) Ra | Ac—Lr 89-103 *Note 2 | 104 Unq | 105 Unp | 106 Unh | 107 Uns | 108 Uno | 109 Une | | | | | | | | | |

*Note 1. Lanthanoid

| 57 (1.69) La | 58 (1.65) Ce | 59 (1.64) Pr | 60 (1.64) Nd | 61 (1.63) Pm | 62 (1.62) Sm | 63 (1.85) Eu | 64 (1.62) Gd | 65 (1.61) Tb | 66 (1.60) Dy | 67 (1.58) Ho | 68 (1.58) Er | 69 (1.58) Tm | 70 (1.70) Yb | 71 (1.56) Lu |
|---|---|---|---|---|---|---|---|---|---|---|---|---|---|---|

*Note 2. Actinoid

| 89 (2.0) Ac | 90 (1.65) Th | 91 Pa | 92 (1.42) U | 93 Np | 94 Pu | 95 Am | 96 Cm | 97 Bk | 98 Cf | 99 Es | 100 Fm | 101 Md | 102 No | 103 Lr |
|---|---|---|---|---|---|---|---|---|---|---|---|---|---|---|

The magnetic coupling layer 13 is formed of a non-magnetic conductive material. The main element of the magnetic coupling layer 13 is Ru, Rh, or Ir. The first magnetization fixed layer 7 and the second magnetization fixed layer 15 are antiferromagnetically, that is, magnetically such that a magnetization direction 7M of the first magnetization fixed layer 7 and a magnetization direction 15M of the second magnetization fixed layer 15 are antiparallel to each other, coupled by exchange coupling (considered as exchange coupling caused by the RKKY interaction) via the first interposed layer 9, the second interposed layer 11, and the magnetic coupling layer 13. Thus, the stack structure from the first magnetization fixed layer 7 to the second magnetization fixed layer 15 of the ferromagnetic multilayer film 10 corresponds to an SAF structure.

The magnitude of magnetization of the first magnetization fixed layer 7 may be the same as or different from the magnitude of magnetization of the magnetic coupling layer 13. The thickness of the magnetic coupling layer 13 is selected such that the first magnetization fixed layer 7 and the second magnetization fixed layer 15 are antiferromagnetically coupled as described above, and the thickness can be, for example, greater than or equal to 0.3 nm and less than or equal to 4.0 nm. An optimal thickness for antiferromagnetic coupling is determined depending on the material of the magnetic coupling layer 13.

Since the thicknesses and the arrangement of the first interposed layer 9 and the magnetic coupling layer 13 are determined as described above, those layers do not substantially affect or sufficiently slightly affect the antiferromagnetic exchange coupling between the first magnetization fixed layer 7 and the second magnetization fixed layer 15. That is, an exchange coupling between two ferromagnetic layers via a magnetic coupling layer is generally significantly affected by the state of the interface between the magnetic coupling layer and the ferromagnetic layers. Thus, if the first magnetization fixed layer 7 is in contact with a layer of which the main element is an element different from the main element of the magnetic coupling layer 13, there is a possibility that the exchange coupling is significantly affected. However, in the present embodiment, the first interposed layer 9 of which the main element is the same element as the main element of the magnetic coupling layer 13 is in contact with the first magnetization fixed layer 7 in a state where the first interposed layer 9 has a thickness greater than or equal to 1.5 times the atomic radius of its main element, and the second interposed layer 11 is disposed between the first interposed layer 9 and the magnetic coupling layer 13. Thus, such a problem is not posed or is posed to only a slight extent.

In addition, if the thickness of the first interposed layer 9 is excessively large, the distance between the first magnetization fixed layer 7 and the second magnetization fixed layer 15 is increased. Thus, there is a possibility that the exchange coupling between these layers is weakened. However, in the present embodiment, the thickness of the first interposed layer 9 is less than or equal to 3.2 times the atomic radius of the main element of the first interposed layer 9. Thus, such a problem is not posed or is posed to only a slight extent.

In addition, if the film thickness of the second interposed layer 11 is large to an extent that the second interposed layer 11 is continuous in the plane direction, there is a possibility that the exchange coupling between the first magnetization fixed layer 7 and the second magnetization fixed layer 15 is weakened. However, in the present embodiment the thickness of the second interposed layer 11 is less than or equal to 1.5 times the atomic radius of the main element of the second interposed layer 11. Thus, the second interposed layer 11 has a discontinuous shape in the plane direction. Thus, since a plurality of regions in which the second interposed layer 11 is not interposed between the first magnetization fixed layer 7 and the second magnetization fixed layer 15 are present, it is possible to prevent or suppress the weakening of the exchange coupling due to the second interposed layer 11.

The magnetization direction 7M of the first magnetization fixed layer 7 and the magnetization direction 15M of the second magnetization fixed layer 15 change less easily than a magnetization direction 23M of the magnetization free layer 23 described below. Preferably, the magnetization direction 7M and the magnetization direction 15M are substantially fixed with respect to an external magnetic field and a spin torque that may be applied to the first magnetization fixed layer 7 and the second magnetization fixed layer 15 at the time of using the magnetoresistive effect element 1. Such substantial fixing can be implemented, for example, by forming the first magnetization fixed layer 7 and the second magnetization fixed layer 15 of a hard magnetic material.

In addition, in order to more strongly fix the magnetization direction 7M of the first magnetization fixed layer 7 and the magnetization direction 15M of the second magnetization fixed layer 15, an antiferromagnetic layer (not illustrated) may be disposed on the surface of the first magnetization fixed layer 7 on a side opposite to the magnetic coupling layer 13 side (in the present embodiment, between the base layer 6 and the first magnetization fixed layer 7), and the antiferromagnetic layer and the first magnetization fixed layer 7 may be magnetically coupled by exchange coupling. Accordingly, the antiferromagnetic layer imparts a uniaxial magnetic anisotropy to the first magnetization fixed layer 7. The material of the antiferromagnetic layer is exemplified, for example, by a FeMn alloy, a PtMn alloy, a PtCrMn alloy, a NiMn alloy, an IrMn alloy, NiO, or $Fe_2O_3$. The thickness of the antiferromagnetic layer can be, for example, greater than or equal to 4.0 nm and less than or equal to 10.0 nm.

The non-magnetic spacer layer 21 is disposed between the second magnetization fixed layer 15 and the magnetization free layer 23. In a case where the non-magnetic spacer layer 21 is formed of a conductive non-magnetic material such as Cu, Ag, Al, NiAl, Si, Ge, or a non-magnetic Heusler alloy, the magnetoresistive effect element 1 is a GMR effect element, and the thickness of the non-magnetic spacer layer 21 can be, for example, greater than or equal to 2.0 nm and less than or equal to 5.0 nm. In a case where the non-magnetic spacer layer 21 is formed of an insulative non-magnetic material such as MgO, $MgAl_2O_4$, or a non-magnetic spinel material, the magnetoresistive effect element 1 is a TMR effect element, and the thickness of the non-magnetic spacer layer 21 can be, for example, greater than or equal to 0.8 nm and less than or equal to 4.0 nm.

The magnetization free layer 23 is formed of a ferromagnetic material having soft magnetic characteristics such as Fe, Co—Fe, Co—Fe—B, or a ferromagnetic Heusler alloy. The magnetization direction 23M of the magnetization free layer 23 is not substantially fixed. Thus, when an external magnetic field of a measurement target, a spin torque, or the like is applied to the magnetization free layer 23, the magnetization direction 23M is easily changed to the direction of the application. By applying the external magnetic field of the measurement target, the spin torque, or the like to the magnetization free layer 23, the relative angle between the magnetization direction 15M of the second magnetization fixed layer 15 and the magnetization direction 23M of the magnetization free layer 23 is changed such that the resistance value of the magnetoresistive effect element 1 is changed, and a magnetoresistive effect is thus exhibited.

The cap layer 25 is disposed in order to protect each layer of the magnetoresistive effect element 1. The cap layer 25 is formed, for example, of one or more metal elements of Ru, Ag, Al, Cu, Au, Cr, Mo, Pt, W, Ta, Pd, and Ir, an alloy of these metal elements, or a stack body of materials of two or more kinds of these metal elements.

Effects of Ferromagnetic Multilayer Film and Magnetoresistive Effect Element In the ferromagnetic multilayer film 10 of the present embodiment, the diffusion of the element constituting the first magnetization fixed layer 7 to the magnetic coupling layer 13 and the diffusion of the element constituting the magnetic coupling layer 13 to the first magnetization fixed layer 7 are suppressed by the presence of the second interposed layer 11. In addition, the thicknesses and the arrangement of the first interposed layer 9 and the second interposed layer 11 are determined such that those layers do not substantially affect or sufficiently slightly affect the exchange coupling between the first magnetization fixed layer 7 and the second magnetization fixed layer 15. Thus, according to the ferromagnetic multilayer film 10 according to the present embodiment, the antiferromagnetic exchange coupling magnetic field between the first magnetization fixed layer 7 and the second magnetization fixed layer 15 is strengthened.

In addition, from the viewpoint of sufficiently exhibiting the effect of suppressing the diffusion of elements between the first magnetization fixed layer 7 and the magnetic coupling layer 13 by the presence of the second interposed layer 11, the second interposed layer 11 is preferably greater than or equal to one times the atomic radius of the main element of the second interposed layer 11.

In addition, in the ferromagnetic multilayer film 10 according to the present embodiment, the main element of the second interposed layer 11 is preferably the same as the main element of the first magnetization fixed layer 7. In this case, since the same element as the main element of the first magnetization fixed layer 7 is present in a region between the first magnetization fixed layer 7 and the magnetic coupling layer 13, entropy related to the main element of the first magnetization fixed layer 7 is increased, compared to that in a case where a different element is present in the region. Thus, the main element of the first magnetization fixed layer 7 is not thermodynamically easily diffused toward the magnetic coupling layer 13, compared to that in a case where a different element is present in the region. In addition, in spite of the presence of the second interposed layer 11, the second interposed layer 11 does not function and can be regarded as not being present in magnetic coupling. Consequently, the antiferromagnetic exchange coupling magnetic field between the first magnetization fixed layer 7 and the second magnetization fixed layer 15 can be further strengthened.

In addition, in the ferromagnetic multilayer film 10 according to the present embodiment, the main element of the second interposed layer 11 is preferably Mo or W. It is known that a material including Mo or W has improved thermal resistance. Thus, in this case, the thermal resistance of the ferromagnetic multilayer film 10 can be improved.

In addition, in the ferromagnetic multilayer film 10 according to the present embodiment, the main element of the second interposed layer 11 is preferably Ti, Zr, Pd, Ag, Hf, Pt, or Au. It is known that Ti, Zr, Pd, Ag, Hf, Pt, and Au, even if included in a magnetic coupling layer between two ferromagnetic layers, almost do not affect the exchange coupling between the two ferromagnetic layers. Thus, in this case, the variation of the magnitude of the antiferromagnetic exchange coupling magnetic field between the first magnetization fixed layer 7 and the second magnetization fixed layer 15 among a plurality of ferromagnetic multilayer films according to the present embodiment can be suppressed.

In addition, in the ferromagnetic multilayer film 10 according to the present embodiment, the thickness of the first magnetization fixed layer 7 is preferably greater than the thickness of the second magnetization fixed layer 15. In this case, in the configuration in the related art (that is, a configuration in which the first interposed layer 9 and the second interposed layer 11 are not present between the first magnetization fixed layer 7 and the magnetic coupling layer 13), the diffusion of elements to the magnetic coupling layer 13 from the first magnetization fixed layer 7 occurs more easily than the diffusion of elements to the magnetic coupling layer 13 from the second magnetization fixed layer 15. Thus, in this case, the effect of the ferromagnetic multilayer film 10 that the diffusion of the element constituting the first magnetization fixed layer 7 to the magnetic coupling layer 13 is suppressed by the presence of the second interposed layer 11 is particularly effectively exhibited. The thickness of the first magnetization fixed layer 7 may be the same as the thickness of the second magnetization fixed layer 15 or may be less than the thickness of the second magnetization fixed layer 15.

In addition, since the magnetoresistive effect element 1 of the present embodiment includes the ferromagnetic multilayer film 10 in which the antiferromagnetic exchange coupling magnetic field between the first magnetization fixed layer 7 and the second magnetization fixed layer 15 is strong, problems caused by weak fixing of the magnetization directions 7M and 15M of the first magnetization fixed layer 7 and the second magnetization fixed layer 15 such as a decrease in magnetoresistive effect ratio (MR ratio) and a decrease in the symmetry of an output signal with respect to the external magnetic field can be suppressed.

While the magnetoresistive effect element 1 of the present embodiment is a magnetoresistive effect element having the CPP structure, the magnetoresistive effect element 1 may be a magnetoresistive effect element having a current in plane (CIP) structure in which the detection current flows along the film surface of each layer. Even in that case, the magnetoresistive effect element 1 exhibits the same effect as described above.

Figure 2:
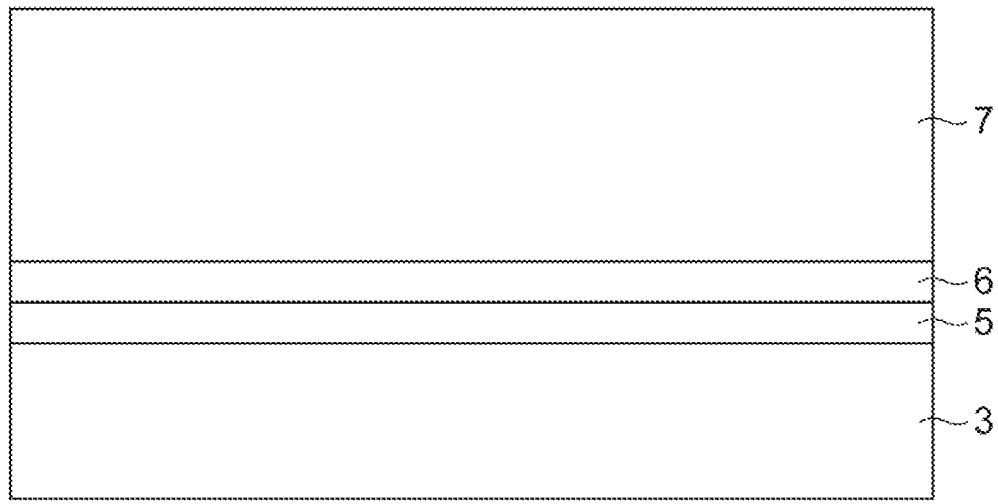
FIG. 2 is a view illustrating a cross-section of elements of the ferromagnetic multilayer film for illustrating a method of manufacturing the ferromagnetic multilayer film.
Figure 3:
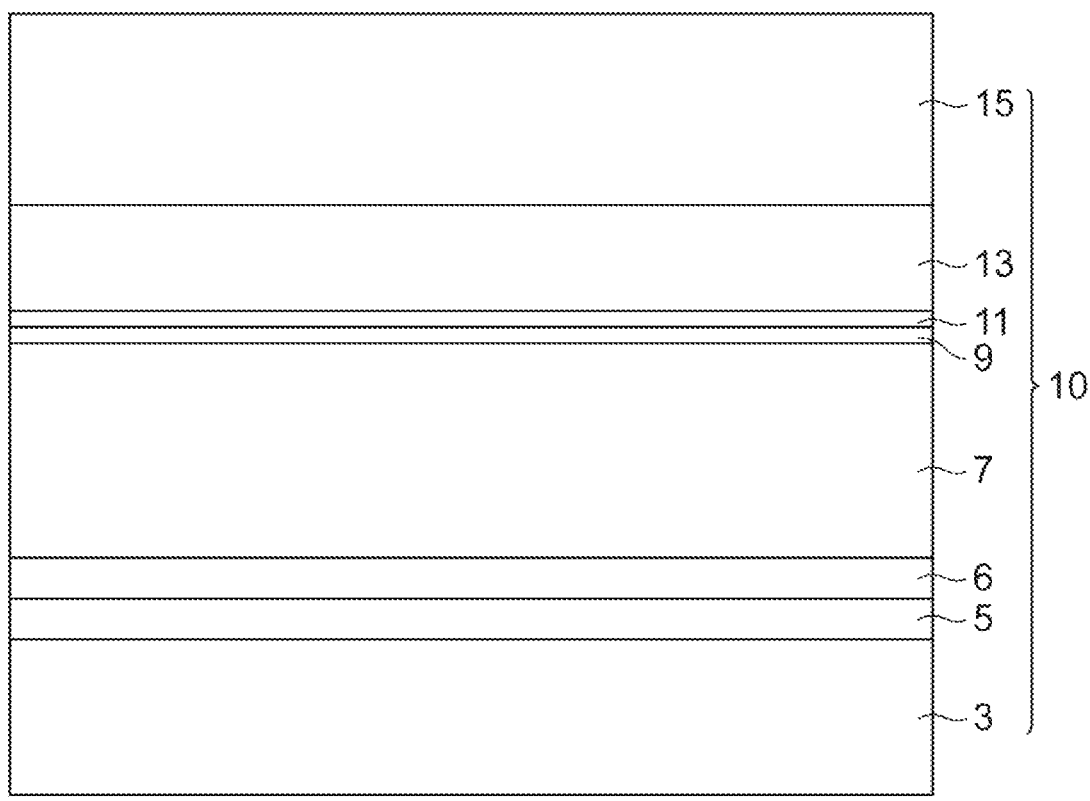
FIG. 3 is a view illustrating a cross-section of the elements of the ferromagnetic multilayer film for illustrating the method of manufacturing the ferromagnetic multilayer film.

Method of Manufacturing Ferromagnetic Multilayer Film and Magnetoresistive Effect Element Next, a method of manufacturing the ferromagnetic multilayer film and the magnetoresistive effect element of the present embodiment will be described. FIG. 2 and FIG. 3 are views illustrating cross-sections of the elements of the ferromagnetic multilayer film for illustrating the method of manufacturing the ferromagnetic multilayer film. The method of manufacturing the ferromagnetic multilayer film of the present embodiment includes a step of forming the crystal orientation layer 5, the base layer 6, the first magnetization fixed layer 7, the first interposed layer 9, the second interposed layer 11, the magnetic coupling layer 13, and the second magnetization fixed layer 15 in this order on the substrate 3.

Specifically, in the step, first, the substrate 3 is prepared as illustrated in FIG. 2. The crystal orientation layer 5, the base layer 6, and the first magnetization fixed layer 7 are stacked in this order on the principal surface of the substrate 3 using a deposition method such as sputtering or vapor deposition. Next, as illustrated in FIG. 3, the first interposed layer 9, the second interposed layer 11, the magnetic coupling layer 13, and the second magnetization fixed layer 15 are formed in this order on the first magnetization fixed layer 7 using the same deposition method. Accordingly, each element constituting the ferromagnetic multilayer film 10 is formed. Then, by forming the non-magnetic spacer layer 21, the magnetization free layer 23, and the cap layer 25 in this order on the second magnetization fixed layer 15 using the same deposition method, each element of the magnetoresistive effect element 1 illustrated in FIG. 1 is formed. Then, if necessary, for example, in order to crystallize each element and impart a uniaxial magnetic anisotropy to the first magnetization fixed layer 7, the second magnetization fixed layer 15, and the magnetization free layer 23, magnetic field heat treatment may be performed on the magnetoresistive effect element 1 including the ferromagnetic multilayer film 10.

In the method of manufacturing the ferromagnetic multilayer film as described above, the first magnetization fixed layer 7 is formed earlier than the magnetic coupling layer 13. Accordingly, even if the element constituting the first magnetization fixed layer 7 is activated by plasma or the like at the time of forming the first magnetization fixed layer 7 by sputtering, the element is not diffused to the magnetic coupling layer 13 at that time. Thus, the ferromagnetic multilayer film 10 in which the antiferromagnetic exchange coupling magnetic field between the first magnetization fixed layer 7 and the second magnetization fixed layer 15 is particularly strong can be acquired.

Magnetic Sensor

Figure 4:
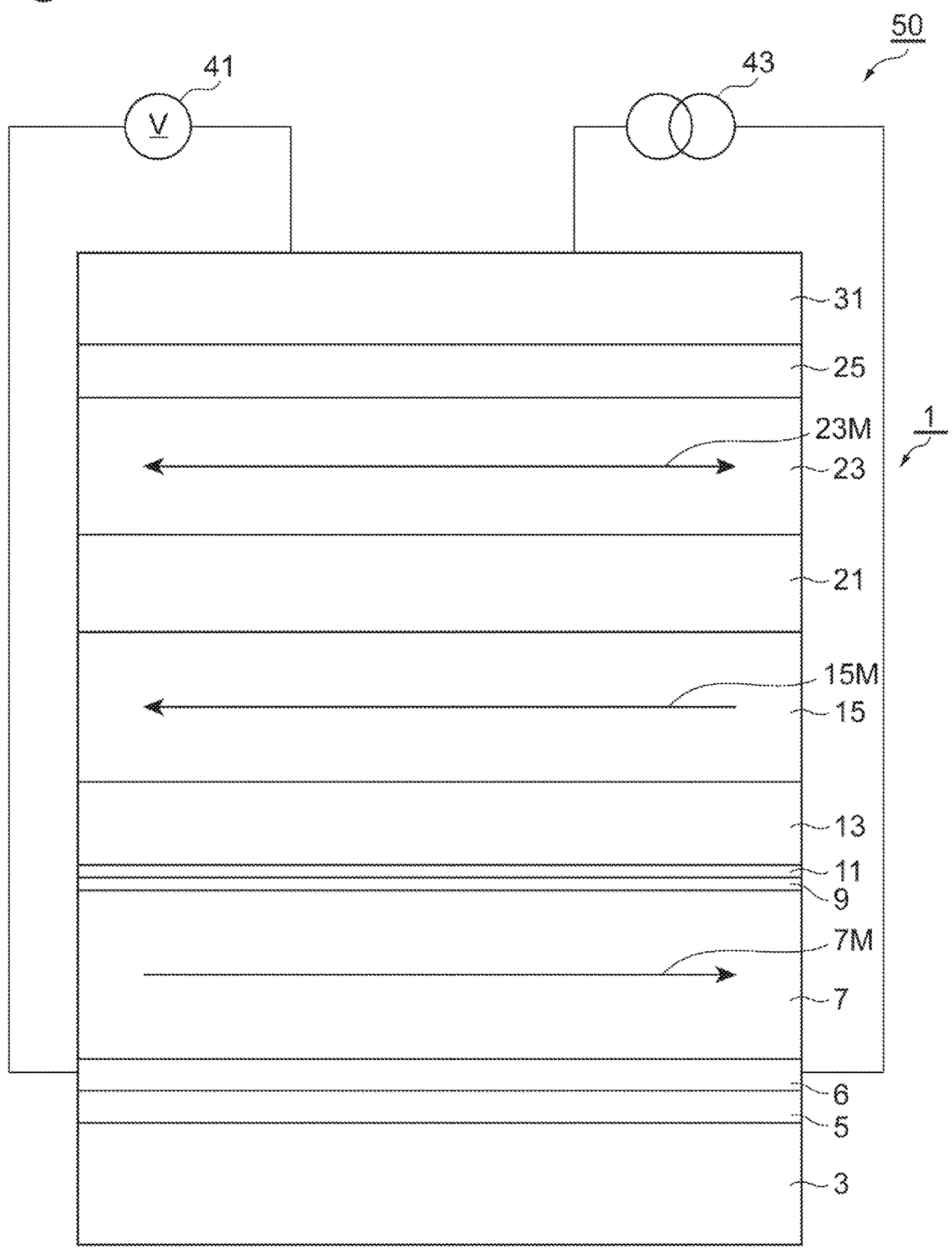
FIG. 4 is a view schematically illustrating a magnetic sensor of the embodiment.

Next, a magnetic sensor according to the present embodiment will be described. FIG. 4 is a view schematically illustrating the magnetic sensor of the present embodiment. As illustrated in FIG. 4, a magnetic sensor 50 of the present embodiment includes the magnetoresistive effect element 1 as described above, an upper electrode 31, a voltmeter 41, and a power supply 43. The upper electrode 31 is disposed on the cap layer 25 and is formed of, for example, at least one metal of Ag, Au, Cu, Cr, V, Al, W, or Pt. The cap layer 25 may include an alloy of these metals or a stack body of materials of two or more kinds of these metals.

Each of the voltmeter 41 and the power supply 43 is electrically connected between the upper electrode 31 and the base layer 6 that functions as a lower electrode. A current can be applied to the magnetoresistive effect element 1 in the stack direction by the power supply 43, and the value of voltage applied to the magnetoresistive effect element 1 can be monitored by the voltmeter 41. At the time of operation, a change in the resistance of the magnetoresistive effect element 1 can be measured by applying the external magnetic field of the measurement target to the magnetization free layer 23 and monitoring the value of voltage applied to the magnetoresistive effect element 1 before and after the application by the voltmeter 41 in a state where a constant current is caused to flow in the magnetoresistive effect element 1 in the stack direction by the power supply 43. The intensity of the external magnetic field is calculated from the measurement result of the change in resistance.

Magnetic Memory

Figure 5:
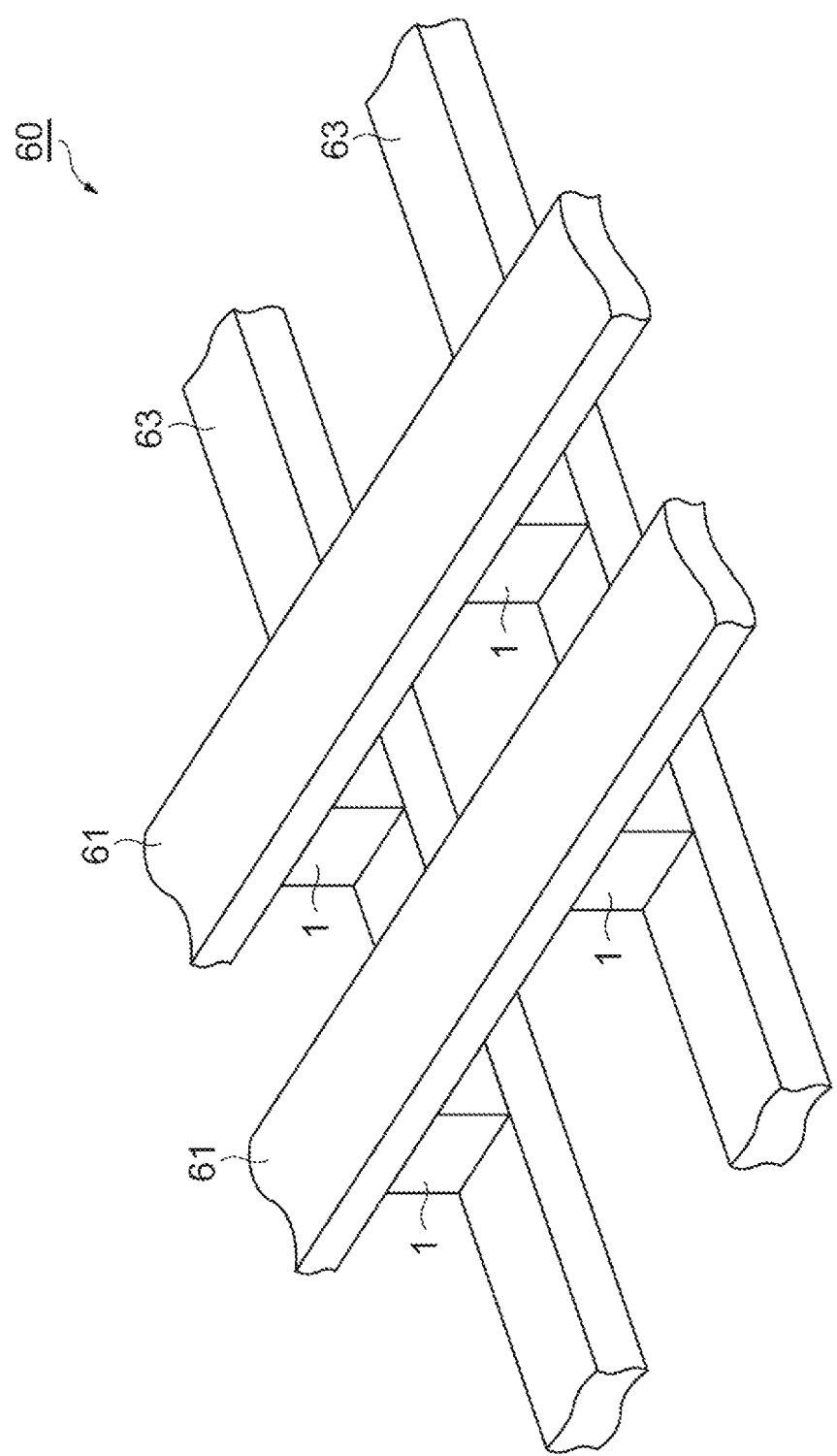
FIG. 5 is a schematic perspective view of a magnetic memory according to the embodiment.
Figure 6:
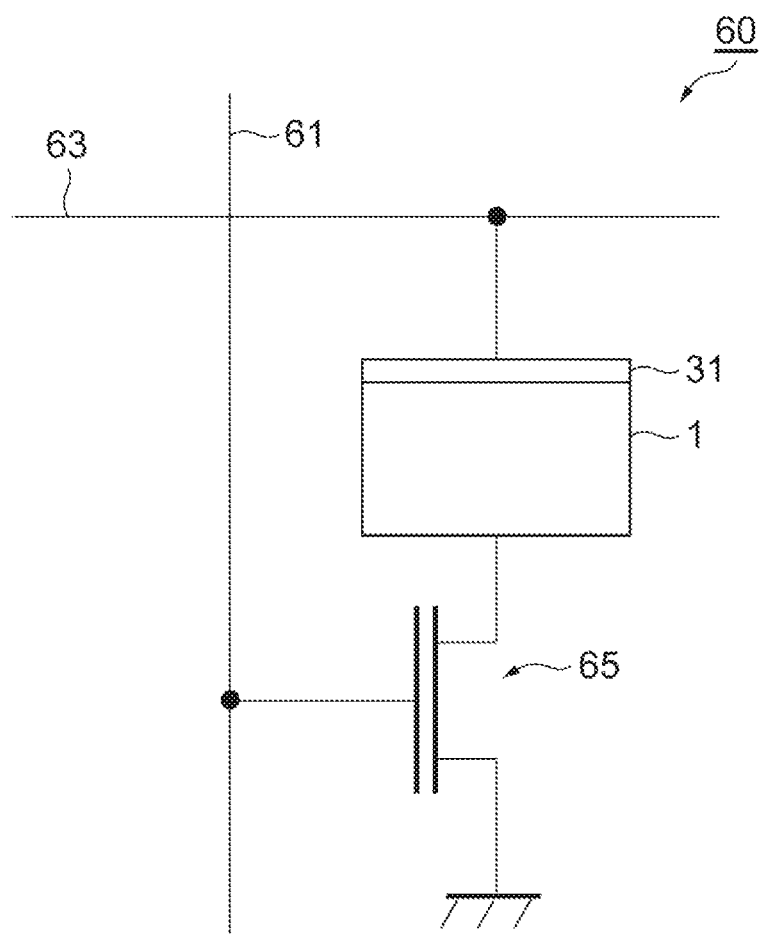
FIG. 6 is a view illustrating an electrical connection configuration of one memory cell of the magnetic memory according to the embodiment.

Next, a magnetic memory according to the present embodiment will be described. FIG. 5 is a schematic perspective view of the magnetic memory according to the present embodiment. FIG. 6 is a view illustrating an electrical connection configuration of one memory cell of the magnetic memory according to the present embodiment. A magnetic memory 60 according to the present embodiment has a configuration in which a plurality of the magnetoresistive effect elements 1 are arranged in a lattice form at intersections between a plurality of word lines 61 and a plurality of bit lines 63 that are wired in a lattice form in a plan view. Accordingly, a plurality of memory cells are arranged in a lattice form. The magnetization direction of the magnetization free layer 23 as a storage layer is set in accordance with storage data. The upper end of the magnetoresistive effect element 1 is connected to the bit line 63 via the upper electrode 31, and the lower end of the magnetoresistive effect element 1 is connected to the drain of a selection transistor 65. The word line 61 is connected to the gate of the transistor 65, and the source of the transistor 65 is connected to the ground.

In a case where data is written into each memory cell, the transistor 65 is switched ON by applying a selection voltage to the corresponding word line 61, and a voltage is applied such that a current of different polarity flows between the bit line 63 and the ground in accordance with the write data (H or L). Accordingly, the magnetization direction of the magnetization free layer 23 is set in accordance with the write data, and the magnetoresistive effect element 1 has a resistance value that corresponds to the written data. In a case where data is read from each memory cell, the transistor 65 is switched ON by applying a selection voltage (H) to the corresponding word line 61, and a low voltage that does not change the magnetization direction of the magnetization free layer 23 is applied between the bit line 63 and the ground. Accordingly, while a current flows between the bit line 63 and the ground via the transistor 65 and the magnetoresistive effect element 1, the magnitude of the value of the current corresponds to the resistance value of the magnetoresistive effect element 1. Thus, the data stored in the memory cell can be detected.

Figure 7:
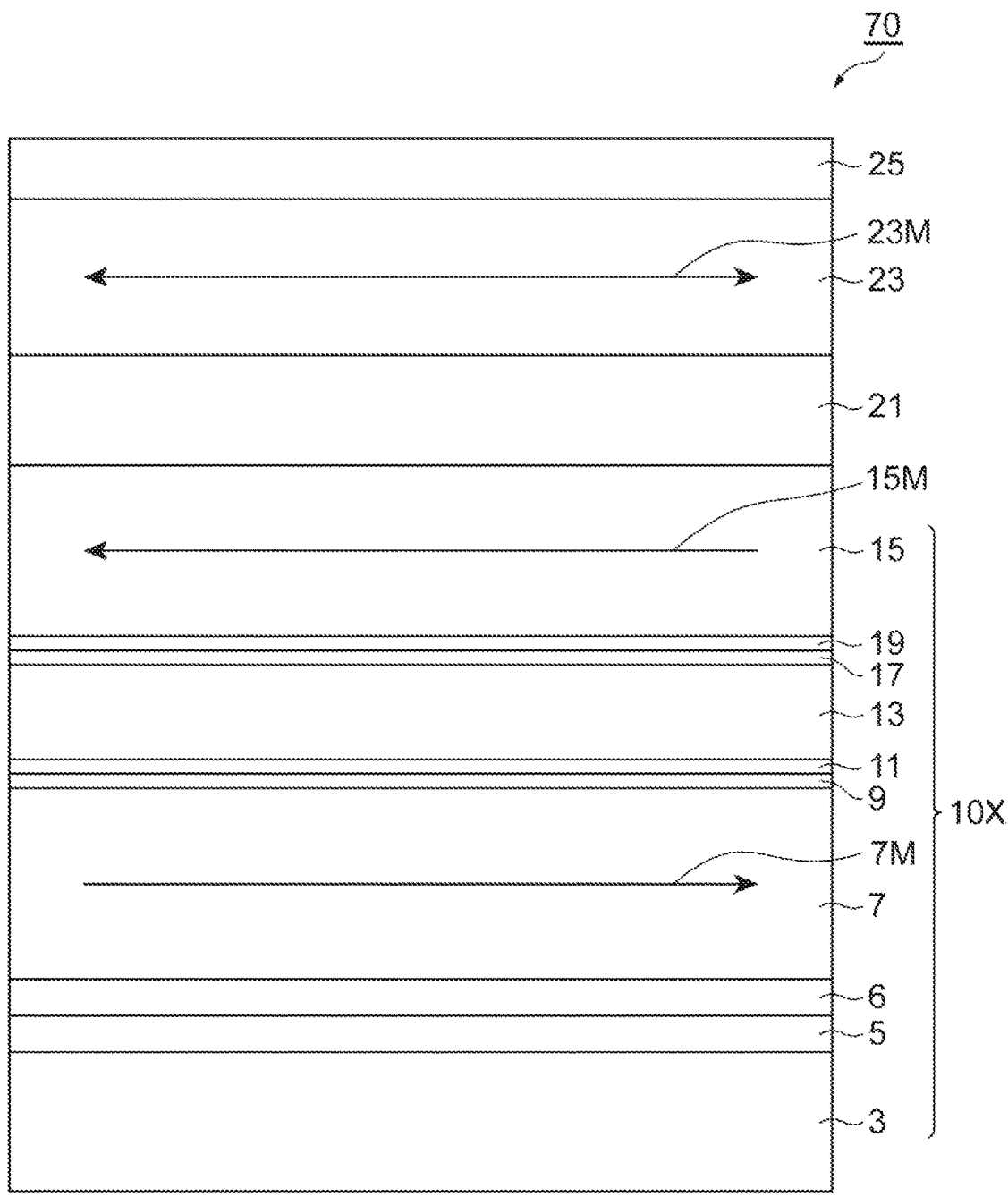
FIG. 7 is a view illustrating a cross-section of a magnetoresistive effect element including a ferromagnetic multilayer film according to a modification example of the embodiment.

Modification Example of Ferromagnetic Multilayer Film and Magnetoresistive Effect Element Next, a modification example of the ferromagnetic multilayer film and the magnetoresistive effect element of the embodiment will be described. FIG. 7 is a view illustrating a cross-section of a magnetoresistive effect element including a ferromagnetic multilayer film according to the modification example of the embodiment. A magnetoresistive effect element 70 of the present modification example is different from the magnetoresistive effect element 1 in terms of the configuration of the ferromagnetic multilayer film. A ferromagnetic multilayer film 10X of the present modification example is different from the ferromagnetic multilayer film 10 in that the ferromagnetic multilayer film 10X further includes a third interposed layer 17 and a fourth interposed layer 19.

The third interposed layer 17 is stacked on the magnetic coupling layer 13, and the fourth interposed layer 19 is stacked on the third interposed layer 17. Thus, the third interposed layer 17 is stacked between the magnetic coupling layer 13 and the second magnetization fixed layer 15, and the fourth interposed layer 19 is stacked between the third interposed layer 17 and the second magnetization fixed layer 15.

The third interposed layer 17 has a configuration corresponding to the second interposed layer 11. That is, the third interposed layer 17 is disposed between the second magnetization fixed layer 15 and the magnetic coupling layer 13 so as to be in contact with the magnetic coupling layer 13. The main element of the third interposed layer 17 is different from the main element (Ru, Rh, or Ir) of the magnetic coupling layer 13. The thickness of the third interposed layer 17 is less than or equal to 1.5 times the atomic radius of the main element of the third interposed layer 17. Since the thickness of the third interposed layer 17 is less than or equal to 1.5 times the atomic radius of the main element of the third interposed layer 17, the thickness is less than the thickness of one atom of the main element. Thus, in a region where the third interposed layer 17 is formed on the lower surface of the magnetic coupling layer 13, the third interposed layer 17 does not have a continuous shape in the plane direction and has a discontinuous shape in the plane direction such as the shape of a plurality of islands. In addition, in this case, the thickness of the third interposed layer 17 is defined as a thickness in a case where the third interposed layer 17 is assumed to have a uniform thickness by calculating the arithmetic mean of the third interposed layer 17 on the whole upper surface of the magnetic coupling layer 13.

The fourth interposed layer 19 has a configuration corresponding to the first interposed layer 9. That is, the fourth interposed layer 19 is disposed between the second magnetization fixed layer 15 and the magnetic coupling layer 13 so as to be in contact with the second magnetization fixed layer 15. The main element of the fourth interposed layer 19 is the same as the main element (Ru, Rh, or Ir) of the magnetic coupling layer 13.

The thickness of the fourth interposed layer 19 is greater than or equal to 1.5 times and less than or equal to 3.2 times the atomic radius of the main element of the fourth interposed layer 19. In a case where the thickness of the fourth interposed layer 19 is less than twice the atomic radius of the main element of the fourth interposed layer 19, the thickness is less than or equal to the thickness of one atom of the main element. In this case, the fourth interposed layer 19 does not have a continuous shape in the plane direction and has a discontinuous shape in the plane direction such as the shape of a plurality of islands. In addition, in this case, the thickness of the fourth interposed layer 19 is defined as a thickness in a case where the fourth interposed layer 19 is assumed to have a uniform thickness by calculating the arithmetic mean of the fourth interposed layer 19 on the whole lower surface of the second magnetization fixed layer 15.

In the ferromagnetic multilayer film 10X of the present modification example, the diffusion of the element constituting the second magnetization fixed layer 15 to the magnetic coupling layer 13 and the diffusion of the element constituting the magnetic coupling layer 13 to the second magnetization fixed layer 15 are suppressed by the presence of the third interposed layer 17. In addition, in the same manner as the thicknesses and the arrangement of the first interposed layer 9 and the second interposed layer 11, the thicknesses and the arrangement of the third interposed layer 17 and the fourth interposed layer 19 are determined such that those layers do not substantially affect or sufficiently slightly affect the exchange coupling between the first magnetization fixed layer 7 and the second magnetization fixed layer 15. Thus, according to the ferromagnetic multilayer film 10X according to the present modification example, the antiferromagnetic exchange coupling magnetic field between the first magnetization fixed layer 7 and the second magnetization fixed layer 15 is further strengthened.

In addition, from the viewpoint of sufficiently exhibiting the effect of suppressing the diffusion of elements between the second magnetization fixed layer 15 and the magnetic coupling layer 13 by the presence of the third interposed layer 17, the magnetic coupling layer 13 is preferably greater than or equal to one times the atomic radius of the main element of the magnetic coupling layer 13.

In addition, based on the same reason as the second interposed layer 11, the main element of the third interposed layer 17 is preferably the same as the main element of the second magnetization fixed layer 15, the main element of the third interposed layer 17 is preferably Mo or W, and the main element of the third interposed layer 17 is preferably Ti, Zr, Pd, Ag, Hf, Pt, or Au.

EXAMPLE

Hereinafter, examples and comparative examples will be described for better understanding of the effect of the present disclosure.

Examples 1 to 3 and Comparative Examples 1 to 3

A ferromagnetic multilayer film of Example 1 that corresponds to the ferromagnetic multilayer film 10 of the embodiment was produced as follows. A 5.0 nm Ta layer, a 20 nm Cu layer, and a 10 nm Ta layer as electrode layers were deposited by sputtering on a Si substrate with a thermal oxide film. Then, the surface is flattened by CMP. Then, a 5.0 nm Co layer as the first magnetization fixed layer 7, a 0.22 nm Ir layer as the first interposed layer 9, a 0.10 nm Co layer as the second interposed layer 11, a 0.5 nm Ir layer as the magnetic coupling layer 13, and a 2.0 nm Co layer as the second magnetization fixed layer 15 were deposited in this order by sputtering. After the deposition, heat treatment is performed under the conditions of 250° C., one hour, and applied magnetic field strength of 10 kOe. A magnetization curve in Example 1 was measured by applying a magnetic field along the magnetization direction of the first magnetization fixed layer. The antiferromagnetic exchange coupling magnetic field (exchange bias magnetic field $H_{EX}$) between the first magnetization fixed layer and the second magnetization fixed layer was evaluated from the amount of shift of the measured magnetization curve in the direction of the magnetic field. Then, a magnetic field annealing process was performed in Example 1 in a vacuum under the conditions of 400° C., one hour, and applied magnetic field strength of 10 kOe. The exchange bias magnetic field $H_{EX}$ was calculated using the same method as described above.

The production of the ferromagnetic multilayer film and the evaluation of the exchange bias magnetic field $H_{EX}$ in Comparative Example 1 were performed in the same manner as the ferromagnetic multilayer film in Example 1 except that an Ir layer as the first interposed layer 9 and a Co layer as the second interposed layer 11 were not deposited.

The production of the ferromagnetic multilayer film and the evaluation of the exchange bias magnetic field $H_{EX}$ in Examples 2 and 3 and Comparative Examples 2 and 3 were performed in the same manner as the ferromagnetic multilayer film in Example 1 except that the thicknesses of the Co layers as the second interposed layer 11 were changed. The thicknesses of the Co layers as the second interposed layer 11 in Examples 2 and 3 and Comparative Examples 2 and 3 were 0.12 nm, 0.15 nm, 0.18 nm, and 0.20 nm, respectively.

Table 2 is a table showing film configurations of the first magnetization fixed layer, the first interposed layer, the second interposed layer, the magnetic coupling layer, and the second magnetization fixed layer, and the measured values of the exchange bias magnetic field $H_{EX}$ before and after the magnetic field annealing process in Examples 1 to 3 and Comparative Examples 1 to 3.

$H_{EX}$ after the annealing process in Comparative Examples 1, 2, and 3. In addition, the rates of decrease in the value of $H_{EX}$ before and after the annealing process in Examples 1, 2, and 3 were lower than that in Comparative Example 1.

Examples 4 to 8 and Comparative Examples 1 and 4 to 6

The production of the ferromagnetic multilayer film and the evaluation of the exchange bias magnetic field $H_{EX}$ in

TABLE 2

| | First Magnetization Fixed Layer (nm) | First Interposed Layer (nm) | Second Interposed Layer (nm) | Magnetic Coupling Layer (nm) | Second Magnetization Fixed Layer (nm) | $H_{EX}$ before Annealing Process (kOe) | $H_{EX}$ after Annealing Process (kOe) |
|---|---|---|---|---|---|---|---|
| Comparative Example 1 | Co (5.0) | Not Provided | Not Provided | Ir (0.5 nm) | Co (2.0) | 11.0 | 10.2 |
| Example 1 | Co (5.0) | Ir (0.22) | Co (0.10) | Ir (0.5 nm) | Co (2.0) | 11.1 | 10.5 |
| Example 2 | Co (5.0) | Ir (0.22) | Co (0.12) | Ir (0.5 nm) | Co (2.0) | 11.3 | 10.7 |
| Example 3 | Co (5.0) | Ir (0.22) | Co (0.15) | Ir (0.5 nm) | Co (2.0) | 11.4 | 10.8 |
| Comparative Example 2 | Co (5.0) | Ir (0.22) | Co (0.18) | Ir (0.5 nm) | Co (2.0) | 10.9 | 10.4 |
| Comparative Example 3 | Co (5.0) | Ir (0.22) | Co (0.20) | Ir (0.5 nm) | Co (2.0) | 10.2 | 9.8 |

Since the atomic radius of the Co element is 0.116 nm, the thicknesses of the second interposed layers in Examples 1, 2, and 3 are less than or equal to 1.5 times (0.174 nm) the atomic radius of the Co element. In Comparative Examples 2 and 3, the thicknesses of the second interposed layers are 1.5 times greater than the atomic radius of the Co element.

Figure 8:
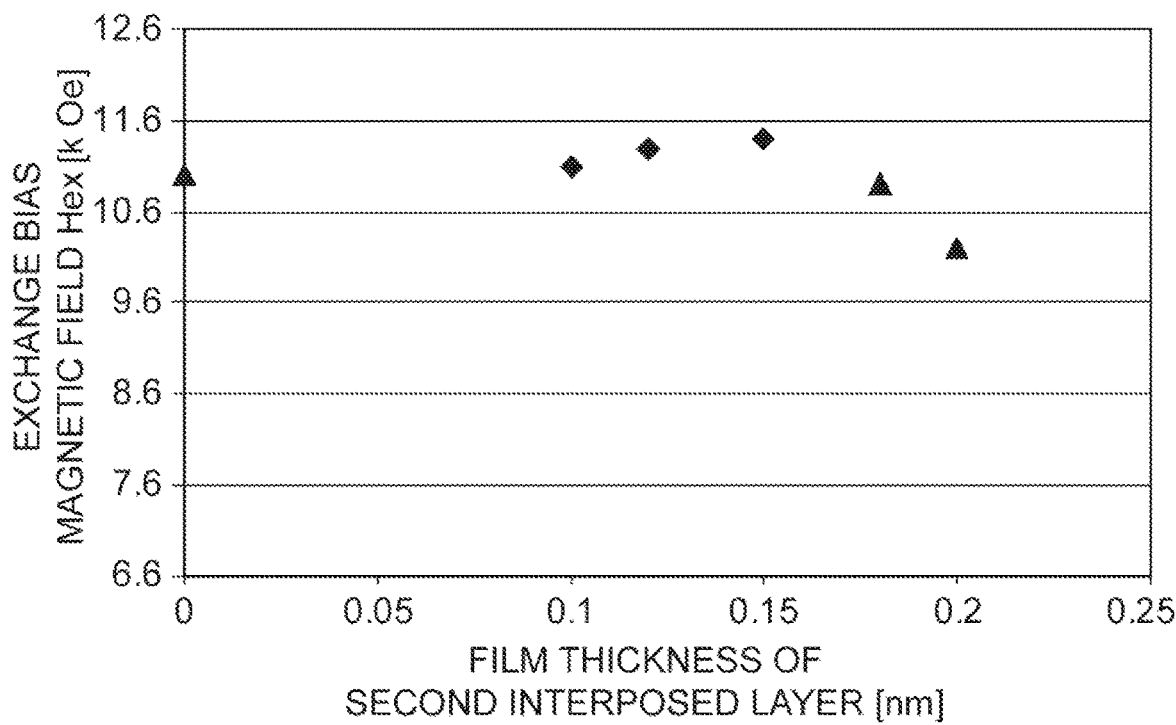
FIG. 8 is a view illustrating dependence of an exchange bias magnetic field $H_{EX}$ on a film thickness of a second interposed layer in Examples 1 to 3 and Comparative Examples 1 to 3.
Figure 8:
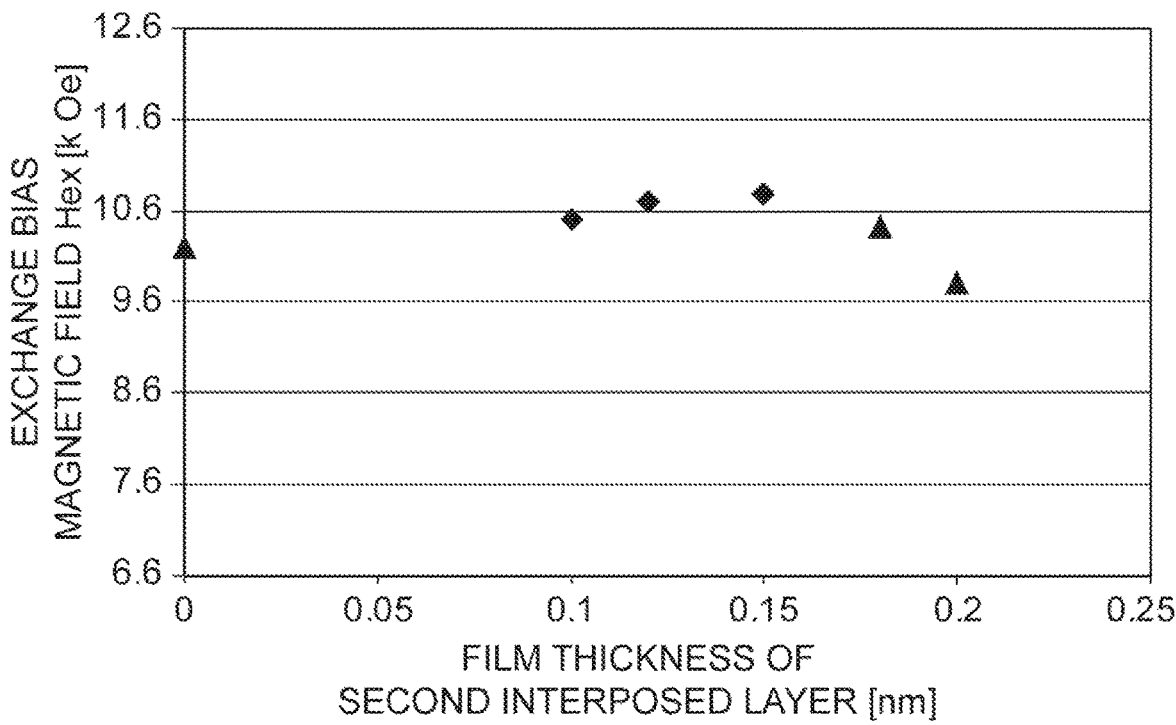

Part (a) of FIG. 8 is a diagram illustrating the dependence of the exchange bias magnetic field $H_{EX}$ on the film thickness of the second interposed layer before the annealing process in Examples 1 to 3 and Comparative Examples 1 to 3. Part (b) of FIG. 8 is a diagram illustrating the dependence of the exchange bias magnetic field $H_{EX}$ on the film thickness of the second interposed layer after the annealing process in Examples 1 to 3 and Comparative Examples 1 to 3. In FIG. 8, each example is illustrated by a plot of ♦, and each comparative example is illustrated by a plot of ▲. The same applies to the plots in FIG. 9 to FIG. 11 below. As illustrated in FIG. 8, the values of $H_{EX}$ before the annealing process and the values of $H_{EX}$ after the annealing process in Examples 1, 2, and 3 were respectively greater than the values of $H_{EX}$ before the annealing process and the values of Examples 4 to 8 and Comparative Examples 4 to 6 were performed in the same manner as the ferromagnetic multilayer film in Example 3 except that the thicknesses of the Ir layers as the first magnetization fixed layer 7 were changed. The thicknesses of the Ir layers as the first magnetization fixed layer 7 in Examples 4 to 8 and Comparative Examples 4 to 6 were 0.10 nm, 0.15 nm, 0.20 nm, 0.22 nm, 0.25 nm, 0.30 nm, 0.40 nm, and 0.45 nm, respectively.

Table 3 is a table showing film configurations of the first magnetization fixed layer, the first interposed layer, the second interposed layer, the magnetic coupling layer, and the second magnetization fixed layer, and the measured values of the exchange bias magnetic field $H_{EX}$ before and after the magnetic field annealing process in Examples 4 to 8 and Comparative Examples 1 and 4 to 6.

TABLE 3

| | First Magnetization Fixed Layer (nm) | First Interposed Layer (nm) | Second Interposed Layer (nm) | Magnetic Coupling Layer (nm) | Second Magnetization Fixed Layer (nm) | $H_{EX}$ before Annealing Process (kOe) | $H_{EX}$ after Annealing Process (kOe) |
|---|---|---|---|---|---|---|---|
| Comparative Example 1 | Co (5.0) | Not Provided | Not Provided | Ir (0.5 nm) | Co (2.0) | 11.0 | 10.2 |
| Comparative Example 4 | Co (5.0) | Ir (0.10) | Co (0.15) | Ir (0.5 nm) | Co (2.0) | 7.8 | 9.2 |
| Comparative Example 5 | Co (5.0) | Ir (0.15) | Co (0.15) | Ir (0.5 nm) | Co (2.0) | 9.8 | 10.0 |
| Example 4 | Co (5.0) | Ir (0.20) | Co (0.15) | Ir (0.5 nm) | Co (2.0) | 10.8 | 10.6 |
| Example 5 | Co (5.0) | Ir (0.22) | Co (0.15) | Ir (0.5 nm) | Co (2.0) | 11.4 | 10.7 |
| Example 6 | Co (5.0) | Ir (0.25) | Co (0.15) | Ir (0.5 nm) | Co (2.0) | 11.5 | 10.8 |
| Example 7 | Co (5.0) | Ir (0.30) | Co (0.15) | Ir (0.5 nm) | Co (2.0) | 11.2 | 10.8 |
| Example 8 | Co (5.0) | Ir (0.40) | Co (0.15) | Ir (0.5 nm) | Co (2.0) | 11.1 | 10.6 |
| Comparative Example 6 | Co (5.0) | Ir (0.45) | Co (0.15) | Ir (0.5 nm) | Co (2.0) | 10.0 | 8.0 |

Since the atomic radius of the Ir element is 0.127 nm, the thicknesses of the first interposed layers in Examples 4 to 8 are greater than or equal to 1.5 times (0.1905 nm) and less than or equal to 3.2 times (0.4064 nm) the atomic radius of the Ir element. The thicknesses of the first interposed layers in Comparative Examples 4 and 5 are less than 1.5 times the atomic radius of the Ir element. The thickness of the first interposed layer in Comparative Example 6 is greater than 3.2 times the atomic radius of the Ir element.

Figure 9:
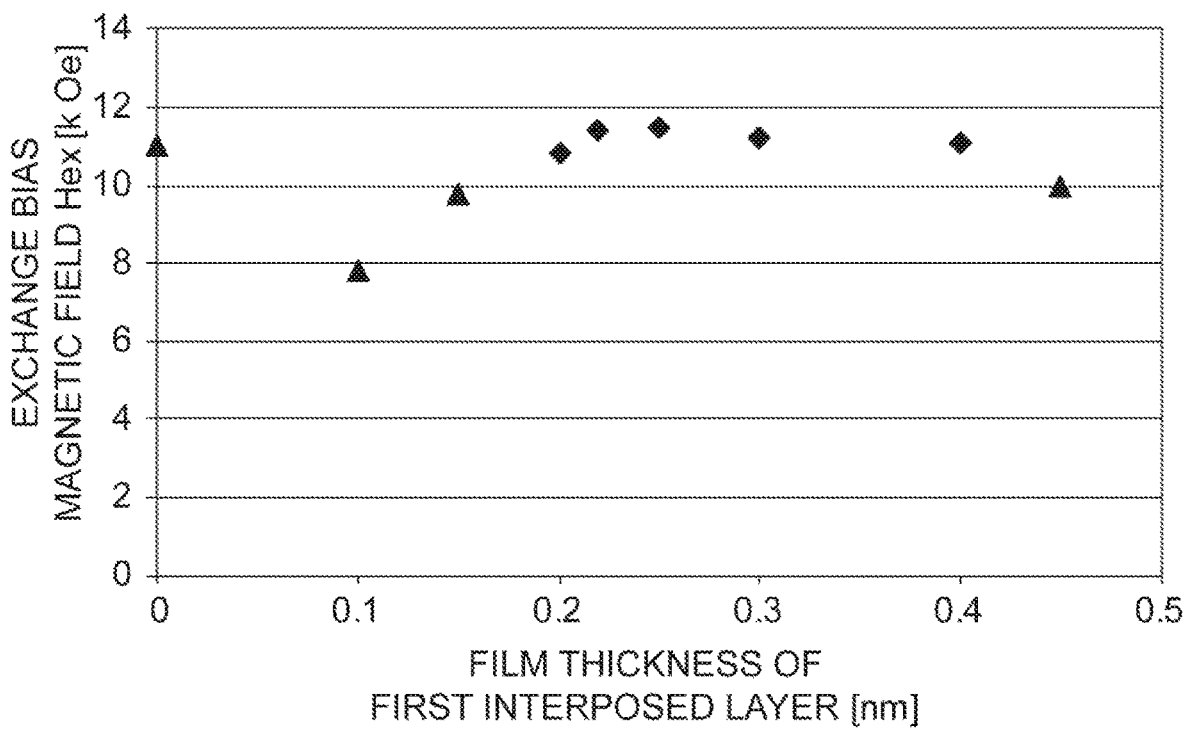
FIG. 9 is a view illustrating dependence of the exchange bias magnetic field $H_{EX}$ on a film thickness of a first interposed layer in Examples 4 to 8 and Comparative Examples 1 and 4 to 6.
Figure 9:
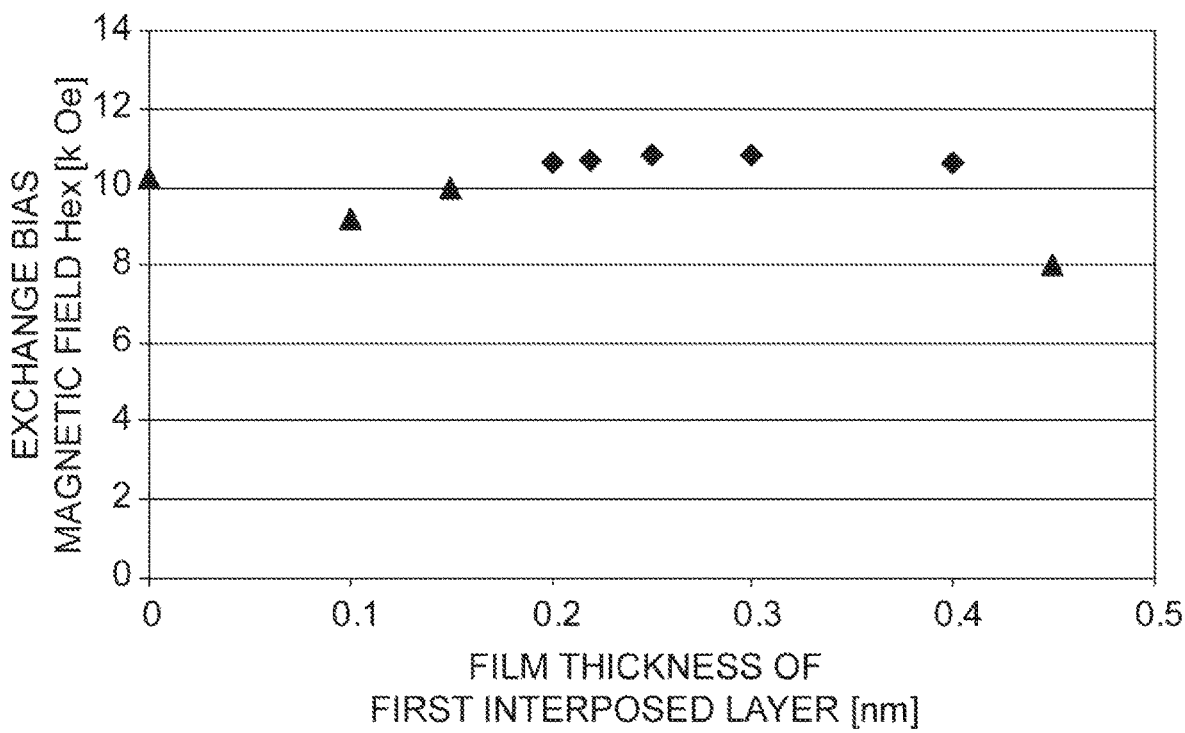

Part (a) of FIG. 9 is a diagram illustrating the dependence of the exchange bias magnetic field $H_{EX}$ on the film thickness of the first interposed layer before the annealing process in Examples 4 to 8 and Comparative Examples 1 and 4 to 6. Part (b) of FIG. 9 is a diagram illustrating the dependence of the exchange bias magnetic field $H_{EX}$ on the film thickness of the first interposed layer after the annealing process in Examples 4 to 8 and Comparative Examples 1 and 4 to 6. As illustrated in FIG. 9, the values of $H_{EX}$ after the annealing process in Examples 4 to 8 were respectively greater than the values of $H_{EX}$ after the annealing process in Comparative Examples 1 and 6. In addition, the rates of decrease in the value of $H_{EX}$ before and after the annealing process in Examples 4 to 8 were lower than that in Comparative Example 1.

Examples 9 to 13 and Comparative Examples 1 and 7

The production of the ferromagnetic multilayer film and the evaluation of the exchange bias magnetic field $H_{EX}$ in Examples 9 to 13 and Comparative Example 7 were performed in the same manner as the ferromagnetic multilayer film in Example 1 except that the constituent material and the thickness of the layer as the second magnetization fixed layer 15 were changed. The constituent material of the layers as the second magnetization fixed layer 15 in Examples 9 to 13 and Comparative Examples 1 and 7 was Mo. The thicknesses of the Mo layers as the second magnetization fixed layer 15 in Examples 9 to 13 and Comparative Example 7 were 0.05 nm, 0.10 nm, 0.12 nm, 0.15 nm, 0.18 nm, and 0.20 nm, respectively.

Table 4 is a table showing film configurations of the first magnetization fixed layer, the first interposed layer, the second interposed layer, the magnetic coupling layer, and the second magnetization fixed layer, and the measured values of the exchange bias magnetic field $H_{EX}$ before and after the magnetic field annealing process in Examples 9 to 13 and Comparative Examples 1 and 7.

7, the thickness of the second interposed layer is 1.5 times greater than the atomic radius of the Mo element.

Figure 10:
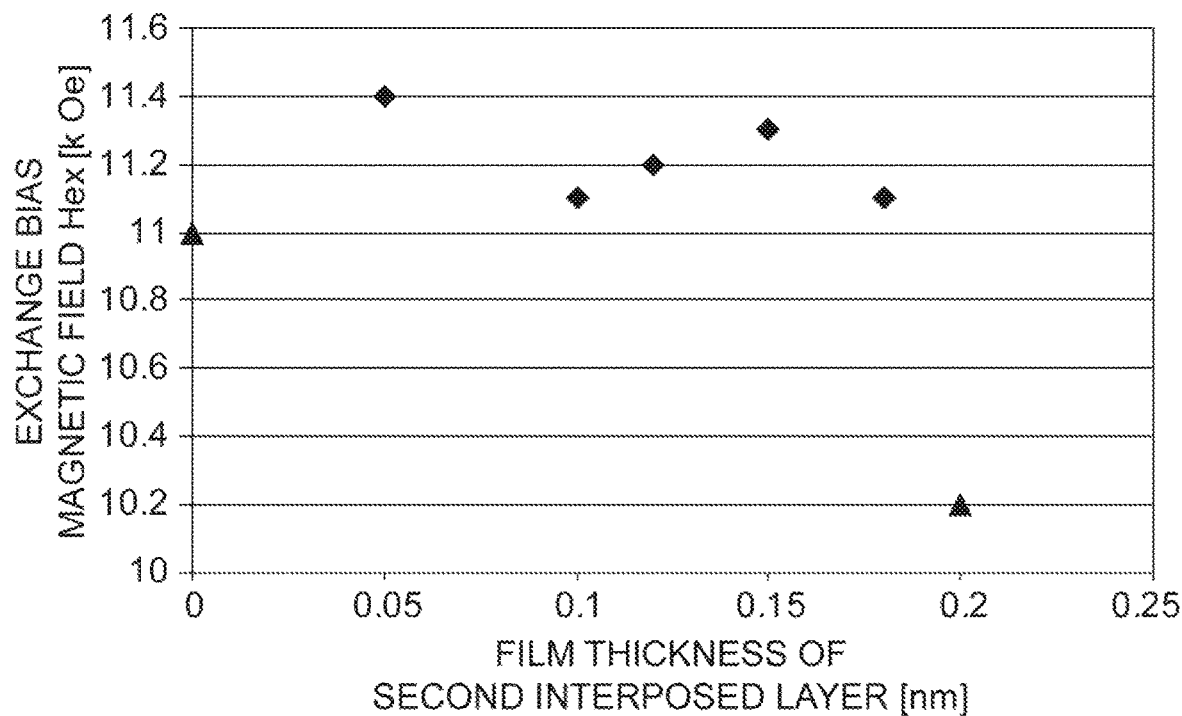
FIG. 10 is a view illustrating the dependence of the exchange bias magnetic field $H_{EX}$ on the film thickness of the second interposed layer in Examples 9 to 13 and Comparative Examples 1 and 7.
Figure 10:
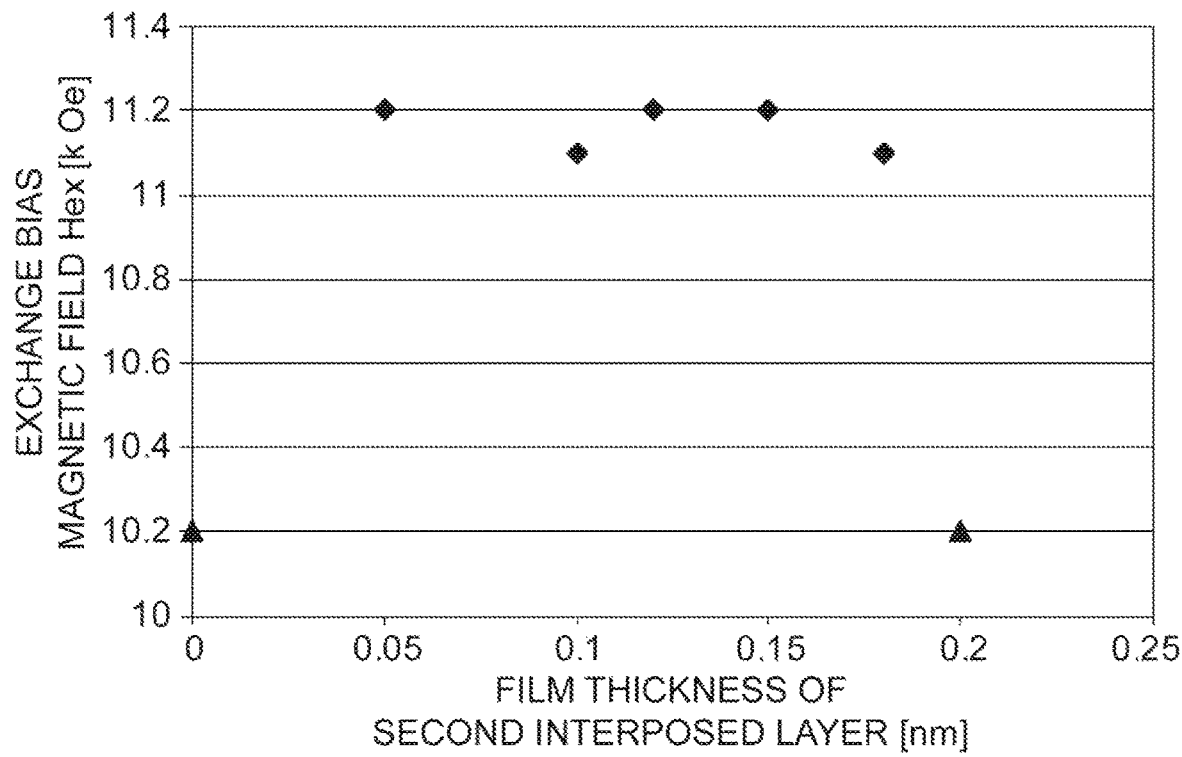

Part (a) of FIG. 10 is a diagram illustrating the dependence of the exchange bias magnetic field $H_{EX}$ on the film thickness of the second interposed layer before the annealing process in Examples 9 to 13 and Comparative Examples 1 and 7. Part (b) of FIG. 10 is a diagram illustrating the dependence of the exchange bias magnetic field $H_{EX}$ on the film thickness of the second interposed layer after the annealing process in Examples 9 to 13 and Comparative Examples 1 and 7. As illustrated in FIG. 10, the values of $H_{EX}$ before the annealing process and the values of $H_{EX}$ after the annealing process in Examples 9 to 13 were respectively greater than the values of $H_{EX}$ before the annealing process and the values of $H_{EX}$ after the annealing process in Comparative Examples 1 and 7. In addition, the rates of decrease in the value of $H_{EX}$ before and after the annealing process in Examples 9 to 13 was lower than that in Comparative Example 1.

Example 14 and Comparative Example 1

The production of the ferromagnetic multilayer film and the evaluation of the exchange bias magnetic field $H_{EX}$ in Example 14 were performed in the same manner as the ferromagnetic multilayer film in Example 3 except that the constituent material and the thickness of the layer as the second magnetization fixed layer 15 were changed. The constituent material of the layer as the second magnetization fixed layer 15 in Example 14 was Pd. The thickness of the Mo layer as the second magnetization fixed layer 15 in Example 14 was 0.15 nm. In addition, 1,000 ferromagnetic multilayer films in Example 14 and Comparative Example 1 were produced under the same production conditions. For each of the plurality of ferromagnetic multilayer films in Example 14 and Comparative Example 1, the variation (standard deviation σ) of the exchange bias magnetic field $H_{EX}$ before the magnetic field annealing process and the variance (standard deviation σ) of the exchange bias magnetic field $H_{EX}$ after the magnetic field annealing process were acquired.

Table 5 is a table showing film configurations of the first magnetization fixed layer, the first interposed layer, the second interposed layer, the magnetic coupling layer, and

TABLE 4

| | First Magnetization Fixed Layer (nm) | First Interposed Layer (nm) | Second Interposed Layer (nm) | Magnetic Coupling Layer (nm) | Second Magnetization Fixed Layer (nm) | $H_{EX}$ before Annealing Process (kOe) | $H_{EX}$ after Annealing Process (kOe) |
|---|---|---|---|---|---|---|---|
| Comparative Example 1 | Co (5.0) | Not Provided | Not Provided | Ir (0.5 nm) | Co (2.0) | 11.0 | 10.2 |
| Example 9 | Co (5.0) | Ir (0.22) | Mo (0.05) | Ir (0.5 nm) | Co (2.0) | 11.4 | 11.2 |
| Example 10 | Co (5.0) | Ir (0.22) | Mo (0.10) | Ir (0.5 nm) | Co (2.0) | 11.1 | 11.1 |
| Example 11 | Co (5.0) | Ir (0.22) | Mo (0.12) | Ir (0.5 nm) | Co (2.0) | 11.2 | 11.2 |
| Example 12 | Co (5.0) | Ir (0.22) | Mo (0.15) | Ir (0.5 nm) | Co (2.0) | 11.3 | 11.2 |
| Example 13 | Co (5.0) | Ir (0.22) | Mo (0.18) | Ir (0.5 nm) | Co (2.0) | 11.1 | 11.1 |
| Comparative Example 7 | Co (5.0) | Ir (0.22) | Mo (0.2) | Ir (0.5 nm) | Co (2.0) | 10.2 | 10.2 |

Since the atomic radius of the Mo element is 0.130 nm, the thicknesses of the second interposed layers in Examples 9 to 13 are less than or equal to 1.5 times (0.195 nm) the atomic radius of the Mo element. In Comparative Example the second magnetization fixed layer, and the measured values of the exchange bias magnetic field $H_{EX}$ before and after the magnetic field annealing process in Example 14 and Comparative Example 1.

TABLE 5

|  | First Magnetization Fixed Layer (nm) | First Interposed Layer (nm) | Second Interposed Layer (nm) | Magnetic Coupling Layer (nm) | Second Magnetization Fixed Layer (nm) | $H_{EX}$ before Annealing Process (kOe) | $H_{EX}$ after Annealing Process (kOe) |
| --- | --- | --- | --- | --- | --- | --- | --- |
| Comparative Example 1 | Co (5.0) | Not Provided | Not Provided | Ir (0.5 nm) | Co (2.0) | 11.0 | 10.2 |
| Example 14 | Co (5.0) | Ir (0.22) | Pd (0.15) | Ir (0.5 nm) | Co (2.0) | 11.2 | 10.8 |

Since the atomic radius of the Pd element is 0.128 nm, the thickness of the second interposed layer in Example 14 is less than or equal to 1.5 times (0.192 nm) the atomic radius of the Pd element.

As shown in Table 5, the value of $H_{EX}$ before the annealing process and the value of $H_{EX}$ after the annealing process in Example 14 were respectively greater than the value of $H_{EX}$ before the annealing process and the value of $H_{EX}$ after the annealing process in Comparative Example 1. In addition, the rate of decrease in the value of $H_{EX}$ before and after the annealing process in Example 14 was lower than that in Comparative Example 1. In addition, while the variation (standard deviation σ) of the exchange bias magnetic field $H_{EX}$ before the magnetic field annealing process in Comparative Example 1 was 7.20%, and the variation (standard deviation σ) of the exchange bias magnetic field $H_{EX}$ after the magnetic field annealing process in Comparative Example 1 was 13.10%, the variation (standard deviation σ) of the exchange bias magnetic field $H_{EX}$ before the magnetic field annealing process in Example 14 was 4.20%, and the variation (standard deviation σ) of the exchange bias magnetic field $H_{EX}$ after the magnetic field annealing process in Comparative Example 1 was 14.90%.

Examples 15 to 19 and Comparative Examples 1 and 8

The production of the ferromagnetic multilayer film and the evaluation of the exchange bias magnetic field $H_{EX}$ in Examples 15 to 19 and Comparative Example 8 were performed in the same manner as the ferromagnetic multilayer film in Example 1 except that the constituent material and the thickness of the layer as the second magnetization fixed layer 15 were changed. The constituent material of the layers as the second magnetization fixed layer 15 in Examples 15 to 19 and Comparative Example 8 was W. The thicknesses of the W layers as the second magnetization fixed layer 15 in Examples 15 to 19 and Comparative Example 8 were 0.06 nm, 0.10 nm, 0.12 nm, 0.15 nm, 0.17 nm, and 0.20 nm, respectively.

Table 6 is a table showing film configurations of the first magnetization fixed layer, the first interposed layer, the second interposed layer, the magnetic coupling layer, and the second magnetization fixed layer, and the measured values of the exchange bias magnetic field $H_{EX}$ before and after the magnetic field annealing process in Examples 15 to 19 and Comparative Examples 1 and 8.

TABLE 6

|  | First Magnetization Fixed Layer (nm) | First Interposed Layer (nm) | Second Interposed Layer (nm) | Magnetic Coupling Layer (nm) | Second Magnetization Fixed Layer (nm) | $H_{EX}$ before Annealing Process (kOe) | $H_{EX}$ after Annealing Process (kOe) |
| --- | --- | --- | --- | --- | --- | --- | --- |
| Comparative Example 1 | Co (5.0) | Not Provided | Not Provided | Ir (0.5 nm) | Co (2.0) | 11.0 | 10.2 |
| Example 15 | Co (5.0) | Ir (0.22) | W (0.06) | Ir (0.5 nm) | Co (2.0) | 11.4 | 11.2 |
| Example 16 | Co (5.0) | Ir (0.22) | W (0.10) | Ir (0.5 nm) | Co (2.0) | 11.1 | 11.1 |
| Example 17 | Co (5.0) | Ir (0.22) | W (0.12) | Ir (0.5 nm) | Co (2.0) | 11.2 | 11.2 |
| Example 18 | Co (5.0) | Ir (0.22) | W (0.15) | Ir (0.5 nm) | Co (2.0) | 11.3 | 11.2 |
| Example 19 | Co (5.0) | Ir (0.22) | W (0.17) | Ir (0.5 nm) | Co (2.0) | 11.1 | 11.1 |
| Comparative Example 8 | Co (5.0) | Ir (0.22) | W (0.20) | Ir (0.5 nm) | Co (2.0) | 10.2 | 10.2 |

Since the atomic radius of the W element is 0.130 nm, the thicknesses of the second interposed layers in Examples 15 to 19 are less than or equal to 1.5 times (0.195 nm) the atomic radius of the W element. In Comparative Example 8, the thickness of the second interposed layer is 1.5 times greater than the atomic radius of the W element.

Figure 11:
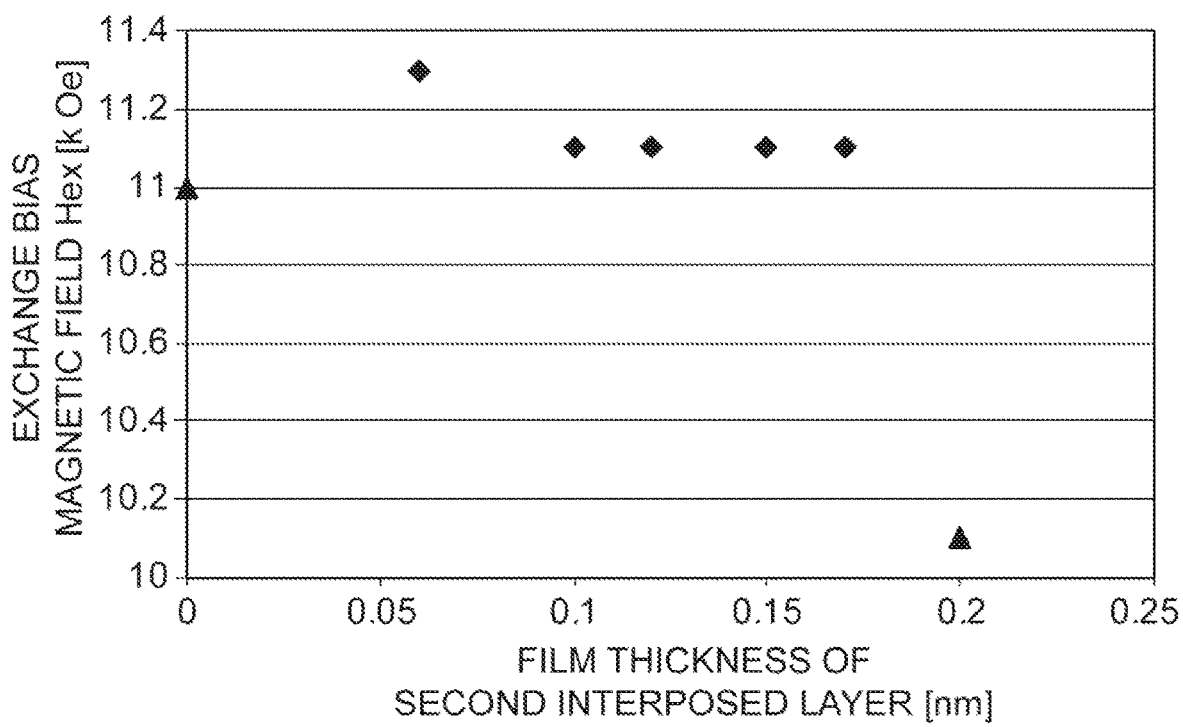
FIG. 11 is a view illustrating the dependence of the exchange bias magnetic field $H_{EX}$ on the film thickness of the second interposed layer in Examples 15 to 19 and Comparative Examples 1 and 8.
Figure 11:
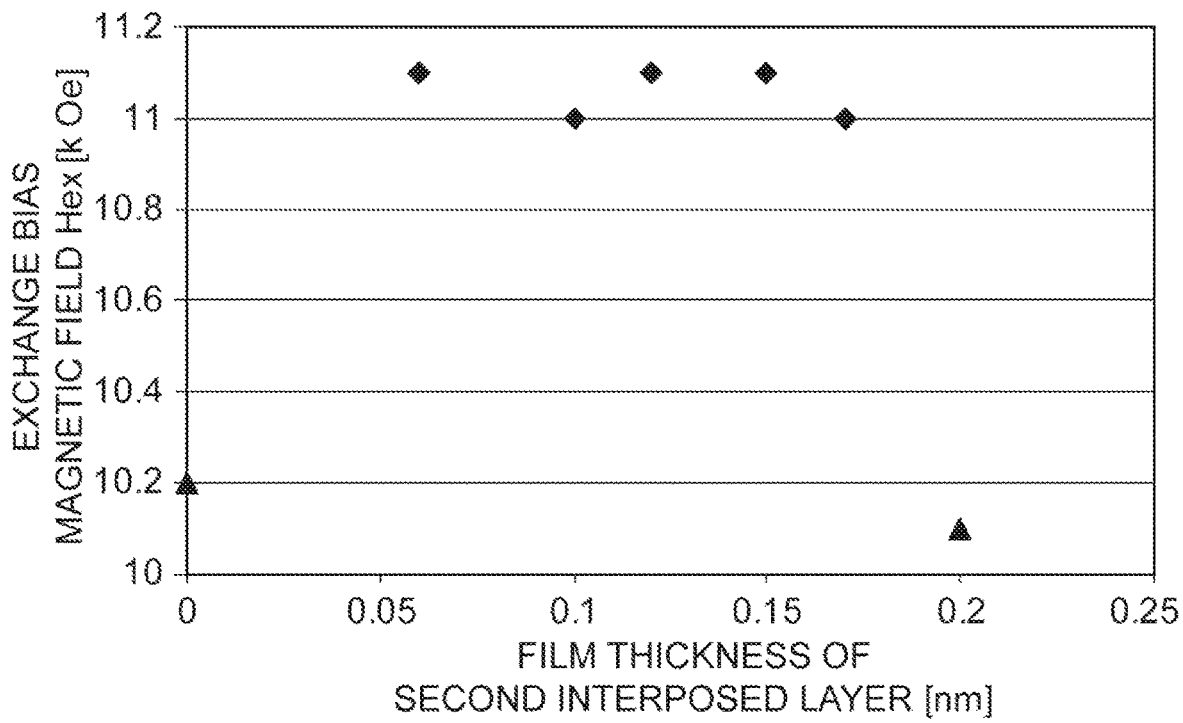

Part (a) of FIG. 11 is a diagram illustrating the dependence of the exchange bias magnetic field $H_{EX}$ on the film thickness of the second interposed layer before the annealing process in Examples 15 to 19 and Comparative Examples 1 and 8. Part (b) of FIG. 11 is a diagram illustrating the dependence of the exchange bias magnetic field $H_{EX}$ on the film thickness of the second interposed layer after the annealing process in Examples 15 to 19 and Comparative Examples 1 and 8. As illustrated in FIG. 11, the values of $H_{EX}$ before the annealing process and the values of $H_{EX}$ after the annealing process in Examples 15 to 19 were respectively greater than the values of $H_{EX}$ before the annealing process and the values of $H_{EX}$ after the annealing process in Comparative Examples 1 and 8. In addition, the rates of decrease in the values of $H_{EX}$ before and after the annealing process in Examples 15 to 19 were lower than that in Comparative Example 1.

Figure 12:
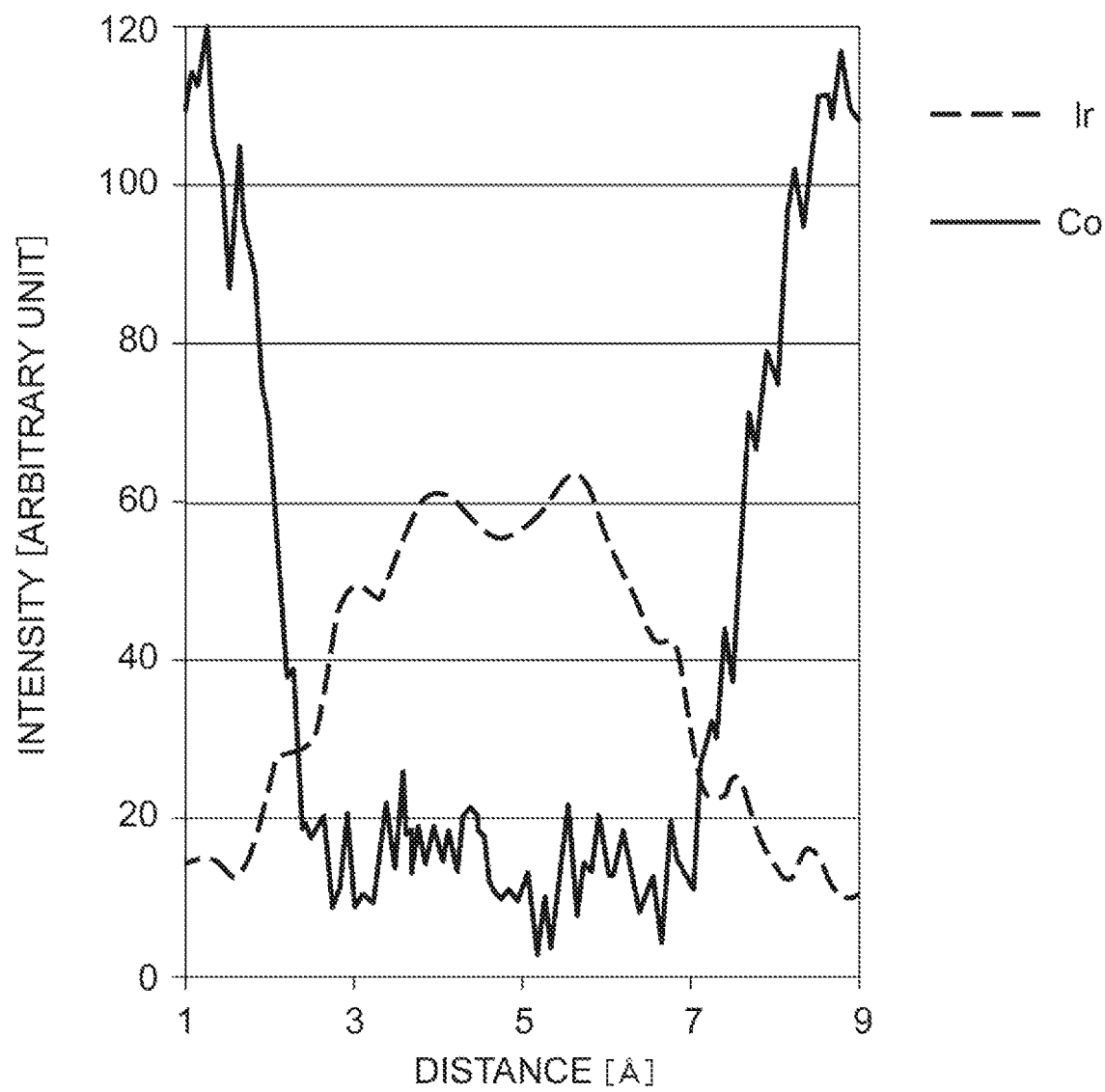
FIG. 12 is a view illustrating a measurement result of energy dispersive X-ray analysis in a comparative example.
Figure 13:
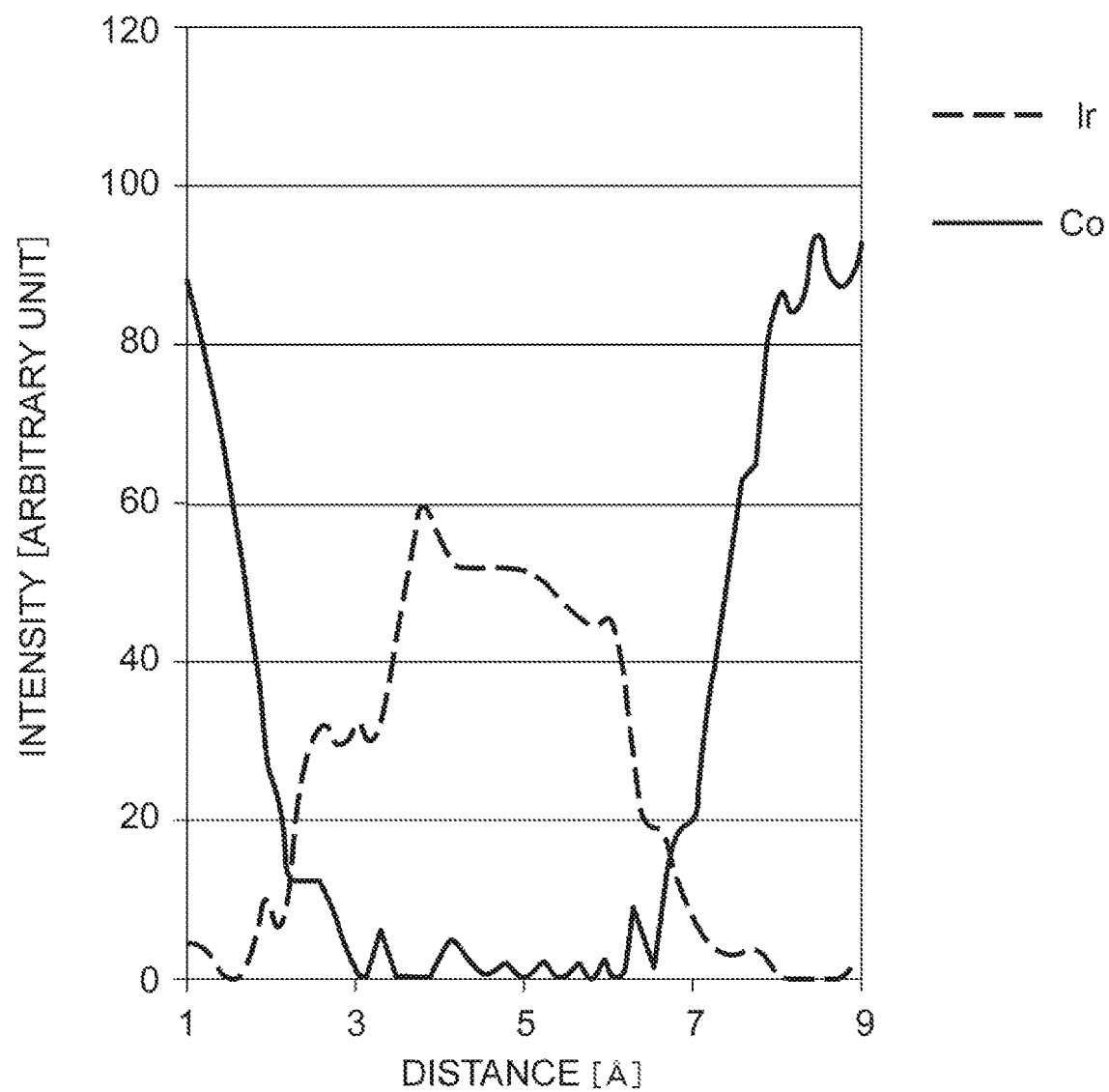
FIG. 13 is a view illustrating a measurement result of energy dispersive X-ray analysis in an example.
Figure 14:
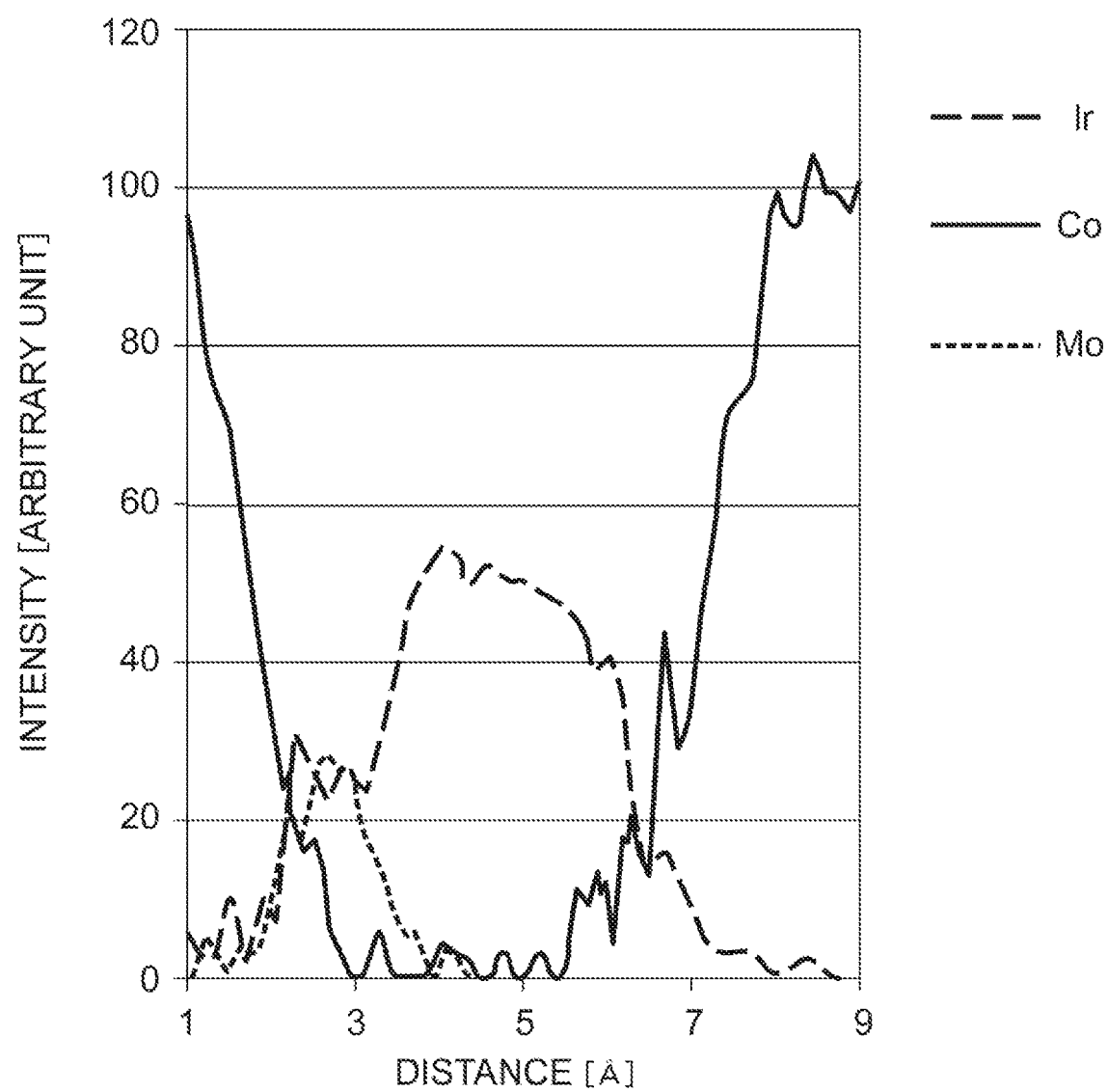
FIG. 14 is a view illustrating a measurement result of energy dispersive X-ray analysis in an example.

In addition, FIG. 12 is a view illustrating a measurement result of energy dispersive X-ray analysis in a region from the first magnetization fixed layer to the second magnetization fixed layer of the ferromagnetic multilayer film in Comparative Example 1. FIG. 13 is a view illustrating a measurement result of energy dispersive X-ray analysis in a region from the first magnetization fixed layer to the second magnetization fixed layer of the ferromagnetic multilayer film in Example 4. FIG. 14 is a view illustrating a measurement result of energy dispersive X-ray analysis in a region from the first magnetization fixed layer to the second magnetization fixed layer of the ferromagnetic multilayer film in Example 12. The positive direction of the horizontal axises of the graphs in FIG. 12 to FIG. 14 is the direction toward the second magnetization fixed layer from the first magnetization fixed layer.

As illustrated in FIG. 12, in the ferromagnetic multilayer film in Comparative Example 1, an intensity profile of Ir that has an approximately laterally symmetric shape and indicates the magnetic coupling layer was observed between intensity profiles of Co indicating the first magnetization fixed layer and the second magnetization fixed layer. In addition, as illustrated in FIG. 13, in the ferromagnetic multilayer film in Example 4, a characteristic peak shape is shown between intensity profiles of Co indicating the first magnetization fixed layer and the second magnetization fixed layer. The peak of Co has a tail between the first magnetization fixed layer and the magnetic coupling layer. Since EDS measurement has finite spatial resolution, the tail is not resolved as a peak in the present measurement. However, since the second interposed layer is present between the first magnetization fixed layer and the magnetic coupling layer, the peak of Co shows a shape of a tail. Similarly, Ir does not have a shape of one peak and has a tail between the first magnetization fixed layer and the magnetic coupling layer. The fact that the shapes of the peaks of Co and Ir have a tail suggests the presence of the first interposed layer and the second interposed layer. In addition, as illustrated in FIG. 14, in the ferromagnetic multilayer film in Example 12, Co does not have a tail between the first magnetization fixed layer and the magnetic coupling layer between intensity profiles of Co indicating the first magnetization fixed layer and the second magnetization fixed layer. This fact indicates that Co is not present between the first magnetization fixed layer and the magnetic coupling layer. In addition, Ir does not have a shape of one peak and has a tail between the first magnetization fixed layer and the magnetic coupling layer. Mo shows a peak shape between the first magnetization fixed layer and the magnetic coupling layer. The peak of Ir loses its intensity in a part closer to the first magnetization fixed layer than the peak of Mo. Accordingly, the structure of the first magnetization fixed layer, the first interposed layer, the second interposed layer, the magnetic coupling layer, and the second magnetization fixed layer is recognized.

REFERENCE SIGNS LIST

1 MAGNETORESISTIVE EFFECT ELEMENT
7 FIRST MAGNETIZATION FIXED LAYER (FIRST FERROMAGNETIC LAYER)
9 FIRST INTERPOSED LAYER
10 FERROMAGNETIC MULTILAYER FILM
11 SECOND INTERPOSED LAYER
13 MAGNETIC COUPLING LAYER
15 SECOND MAGNETIZATION FIXED LAYER
21 NON-MAGNETIC SPACER LAYER
23 MAGNETIZATION FREE LAYER

The invention claimed is:
1. A ferromagnetic multilayer film comprising:
a first ferromagnetic layer;
a first interposed layer stacked on the first ferromagnetic layer;
a second interposed layer stacked on the first interposed layer;
a magnetic coupling layer stacked on the second interposed layer; and
a second ferromagnetic layer stacked on the magnetic coupling layer,
wherein the first ferromagnetic layer and the second ferromagnetic layer are magnetically coupled by exchange coupling via the first interposed layer, the second interposed layer, and the magnetic coupling layer such that magnetization directions of the first ferromagnetic layer and the second ferromagnetic layer are antiparallel to each other,
a main element of the magnetic coupling layer is Ru, Rh, or Ir,
a main element of the first interposed layer is the same as the main element of the magnetic coupling layer,
a main element of the second interposed layer is different from the main element of the magnetic coupling layer, and
in energy dispersive X-ray analysis in a region from the first ferromagnetic layer to the second ferromagnetic layer, an intensity profile of the main element of the first interposed layer and the magnetic coupling layer has a tail and a shoulder between the first ferromagnetic layer and the magnetic coupling layer and constantly corresponds to substantially finite intensities between the first ferromagnetic layer and the magnetic coupling layer.
2. The ferromagnetic multilayer film according to claim 1, wherein the main element of the second interposed layer is different from a main element of the first ferromagnetic layer, and
in energy dispersive X-ray analysis in a region from the first ferromagnetic layer to the second ferromagnetic layer, a peak of the intensity profile of the main element of the second interposed layer overlaps with the shoulder of the intensity profile of the main element of the first interposed layer and the magnetic coupling layer.
3. The ferromagnetic multilayer film according to claim 1, wherein the main element of the second interposed layer is the same as a main element of the first ferromagnetic layer.
4. The ferromagnetic multilayer film according to claim 1, wherein the main element of the second interposed layer is Mo or W.
5. The ferromagnetic multilayer film according to claim 1, wherein the main element of the second interposed layer is Ti, Zr, Pd, Ag, Hf, Pt, or Au.
6. The ferromagnetic multilayer film according to claim 1, wherein a thickness of the first ferromagnetic layer is greater than a thickness of the second ferromagnetic layer.
7. A magnetoresistive effect element comprising:
the ferromagnetic multilayer film according to claim 1;
a non-magnetic spacer layer stacked on the second ferromagnetic layer; and
a magnetization free layer stacked on the non-magnetic spacer layer and formed of a ferromagnetic material,
wherein the first ferromagnetic layer and the second ferromagnetic layer function as magnetization fixed layers.
8. A magnetic sensor comprising:
the magnetoresistive effect element according to claim 7.
9. A magnetic memory comprising:
the magnetoresistive effect element according to claim 7.

10. A method of manufacturing the ferromagnetic multilayer film according to claim 1, the method comprising:
a step of forming the first ferromagnetic layer, the first interposed layer, the second interposed layer, the magnetic coupling layer, and the second ferromagnetic layer in this order on a substrate.

11. The ferromagnetic multilayer film according to claim 3,
wherein a thickness of the first ferromagnetic layer is greater than a thickness of the second ferromagnetic layer.

12. A magnetoresistive effect element comprising:
the ferromagnetic multilayer film according to claim 3;
a non-magnetic spacer layer stacked on the second ferromagnetic layer; and
a magnetization free layer stacked on the non-magnetic spacer layer and formed of a ferromagnetic material,
wherein the first ferromagnetic layer and the second ferromagnetic layer function as magnetization fixed layers.

13. A magnetoresistive effect element comprising:
the ferromagnetic multilayer film according to claim 4;
a non-magnetic spacer layer stacked on the second ferromagnetic layer; and
a magnetization free layer stacked on the non-magnetic spacer layer and formed of a ferromagnetic material,
wherein the first ferromagnetic layer and the second ferromagnetic layer function as magnetization fixed layers.

14. A magnetoresistive effect element comprising:
the ferromagnetic multilayer film according to claim 5;
a non-magnetic spacer layer stacked on the second ferromagnetic layer; and
a magnetization free layer stacked on the non-magnetic spacer layer and formed of a ferromagnetic material,
wherein the first ferromagnetic layer and the second ferromagnetic layer function as magnetization fixed layers.

15. A magnetoresistive effect element comprising:
the ferromagnetic multilayer film according to claim 6;
a non-magnetic spacer layer stacked on the second ferromagnetic layer; and
a magnetization free layer stacked on the non-magnetic spacer layer and formed of a ferromagnetic material,
wherein the first ferromagnetic layer and the second ferromagnetic layer function as magnetization fixed layers.

16. A magnetoresistive effect element comprising:
the ferromagnetic multilayer film according to claim 11;
a non-magnetic spacer layer stacked on the second ferromagnetic layer; and
a magnetization free layer stacked on the non-magnetic spacer layer and formed of a ferromagnetic material,
wherein the first ferromagnetic layer and the second ferromagnetic layer function as magnetization fixed layers.

* * * * *